United States Patent
Lim

(10) Patent No.: US 7,554,479 B2
(45) Date of Patent: Jun. 30, 2009

(54) PSEUDO-MULTIPLE SAMPLING METHODS, SYSTEMS AND DEVICES FOR ANALOG-TO-DIGITAL CONVERSION

(75) Inventor: Yong Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 11/962,398

(22) Filed: Dec. 21, 2007

(65) Prior Publication Data

US 2009/0066554 A1    Mar. 12, 2009

(30) Foreign Application Priority Data

Sep. 11, 2007   (KR) ................. 10-2007-0091943

(51) Int. Cl.
   *H03M 1/56* (2006.01)
(52) U.S. Cl. ....................... 341/169; 327/147
(58) Field of Classification Search .......... 341/155–170
   See application file for complete search history.

(56) References Cited

U.S. PATENT DOCUMENTS

| | | | | |
|---|---|---|---|---|
| 5,475,325 A | * | 12/1995 | Nezu | 327/147 |
| 5,608,402 A | * | 3/1997 | Distinti | 341/162 |
| 6,895,318 B1 | * | 5/2005 | Barton et al. | 701/42 |
| 6,940,345 B2 | * | 9/2005 | Nair et al. | 330/51 |
| 7,088,279 B2 | | 8/2006 | Muramatsu et al. | |
| 7,129,883 B2 | | 10/2006 | Muramatsu et al. | |

OTHER PUBLICATIONS

Nitta et al. "High-Speed Digital Double Sampling with Analog CDS on Column Parallel ADC Architecture for Low-Noise Active Pixel Sensor" *IEEE International Solid-State Circuits Conference* (2006) 8 pp.
Sugiki et al. "A 60mW 10b CMOS Image Sensor with Column-to-Column FPN Reduction" *IEEE International Solid-State Circuits Conference* (2000) 3 pp.
Yoshihara et al. "A 1/1.8-inch 6.4 Mpixel 60 frames/s CMOS Image Sensor With Seamless Mode Change" *IEEE Journal of Solid-State Circuits* 41(12):2998-3006 (2006).
Yoshihara et al. "A 1/1.8-inch 6.4 Mpixel 60 frames/s CMOS Image Sensor With Seamless Mode Change" *IEEE International Solid-State Circuits Conference* (2006) 10 pp.
U.S. Appl. No. 11/887,027, Ham et al.

* cited by examiner

*Primary Examiner*—Lam T Mai
(74) *Attorney, Agent, or Firm*—Myers Bigel Sibley & Sajovec, P.A.

(57) ABSTRACT

An analog signal is converted to a digital value having a given number of bits that define given quantization levels, by repeatedly sampling the analog signal at a resolution that is less than that which is defined by the given number of bits. Lower resolution sampling results are thereby obtained. The lower resolution sampling results are summed to obtain the digital value having the given number of bits.

25 Claims, 28 Drawing Sheets

|  | M=1 | M=2 | QLP1 | QLP2 | QLP3 | QLP4 |
|---|---|---|---|---|---|---|
| Output Code 1 | 13 | 6 + 7 = 13 | \multicolumn{4}{c}{M=4, 3 + 3 + 3 + 4 = 13} | | | |
| Output Code 2 | 4 | 2 + 2 = 4 | \multicolumn{4}{c}{1 + 1 + 1 + 1 = 4} | | | |

FIG. 7

| | M=1 | M=2 | M=3 | M=4 | M=5 |
|---|---|---|---|---|---|
| $V_{in:max}$ 15 | | | | | |
| 14 | | | | | |
| Analog 13 | | | | | 3 |
| Input 1 12 | | | | | |
| 11 | | 8 | | | 3 |
| 10 | | 7 | 5 | 4 | |
| 9 | | 7 | 5 | 4 | 3 |
| 8 | | 6 | | | |
| 7 | | 6 | 4 | 3 | 3 |
| 6 | | 5 | | 3 | |
| 5 | | 4 | 3 | | 2 |
| 4 | | | 3 | 3 | 2 |
| 3 | | 3 | 2 | 2 | |
| Analog 2 | | 2 | 2 | 2 | 1 |
| Input 2 1 | | | 1 | 1 | 1 |
| $V_{in:min}$ 0 | | 0 | 0 | 0 | 0 |
| Output Code 1 | 13 | 6+7=13 | 4+5+4=13 | 3+3+3+4=13 | 2+3+3+3+2=13 |
| Output Code 2 | 4 | 2+2=4 | 1+2+1=4 | 1+1+1+1=4 | 0+1+1+1+1=4 |

FIG. 8

PSEUDO-MULTIPLE SAMPLING METHODS, SYSTEMS AND DEVICES FOR ANALOG-TO-DIGITAL CONVERSION

CROSS-REFERENCE TO RELATED APPLICATION

This application claims priority under 35 USC §119 to Korean Patent Application No. 10-2007-0091943, filed on Sep. 11, 2007, the disclosure of which is hereby incorporated herein by reference in its entirety as if set forth fully herein.

FIELD OF THE INVENTION

This invention relates to electronic circuits and methods, and more particularly to analog-to-digital converter systems, methods and devices.

BACKGROUND OF THE INVENTION

An analog-to-digital converter (ADC) is a widely used electronic device that converts continuous signals to discrete digital numbers. Typically, an ADC is an electronic device that converts an input analog voltage or current to a digital number. The resolution of the ADC indicates the number of discrete values it can produce over the range of analog voltage or current values. The discrete values are typically stored electronically in binary form. Accordingly, the resolution is usually expressed as a number of bits, since the number of discrete values available ("quantization levels") is usually a power of two. For example, an ADC with a resolution of 8 bits can encode an analog input into one of 256 different quantization levels.

One widely used ADC is a ramp-compare ADC which produces a saw-tooth signal that ramps up and then quickly falls to zero. When the ramp starts, a timer starts counting. When the ramp voltage matches the analog input signal, a comparator fires, and the timer's value is recorded. Ramp-compare ADCs are widely used in many applications, for example, in CMOS Image Sensors (CIS) that are widely used in, for example, compact digital cameras. A CIS may be highly integrated and can provide a column-parallel pixel read-out so that column-parallel ADCs can be provided. In these column-parallel ADCs, a plurality of ramp-compare ADCs may be provided using a common ramp voltage generator and a controller.

Noise may be a problem in an ADC. Noise may be generated in the analog input signal, in the digital output signal and/or within the ADC itself. It is known to reduce noise using a multiple sampling technique, wherein an analog signal is converted to a digital value multiple times and the average of the converted values is used as a final output. Since the noise generally is uncorrelated, the multiple sampling plus averaging can reduce noise, at the potential expense of a longer analog-to-digital conversion time to carry out the multiple sampling and/or added hardware complexity of additional memory to store the multiple digital values and to average these values.

SUMMARY OF THE INVENTION

An analog signal is converted to a digital value having a predetermined number of bits that define predetermined quantization levels, according to various embodiments of the present invention, by repeatedly sampling the analog signal at a resolution that is less than that which is defined by the predetermined number of bits. The repeated sampling includes the predetermined quantization levels of the predetermined number of bits. A plurality of lower resolution sampling results is thereby obtained. The plurality of lower resolution sampling results is summed to obtain the digital value having the predetermined number of bits. This repeated lower resolution sampling and summing may be referred to as "pseudo-multiple sampling" because the multiple sampling takes place at a resolution that is less than that which is defined by the predetermined number of bits, and the results of the repeated lower resolution sampling are summed, rather than averaged, such that the sum of the lower resolution sampling results provides the digital value.

In some embodiments, repeatedly sampling the analog signal comprises repeatedly sampling the analog signal using a series of ramp-up and ramp-down sampling voltages. The series of ramp-up and ramp-down sampling voltages can comprise a series of staircase, constant slope and/or multiple slope (non-staircase) ramp-up and ramp-down sampling voltages. Moreover, the repeated sampling may take place by repeatedly sampling the analog signal at a resolution that is less than that which is defined by the predetermined number of bits, using quantization levels among the repeated samplings that are offset from one another. The quantization levels may be equally spaced apart and/or unequally spaced apart.

In some embodiments, the analog signal is repeatedly sampled M times using $2^N/M$ quantization levels, where N is the predetermined number of bits. Moreover, in some embodiments, the quantization levels may be offset from one another among the repeated samplings by at least a quantization level that corresponds to a Least Significant Bit (LSB) of the digital value. In other embodiments, a series of ramp voltages may be generated having a total of M ramp-up and ramp-down voltages (for example, M/2 ramp-up and M/2 ramp-down voltages) wherein a respective ramp-up and ramp-down voltage includes $2^N/M$ ramp voltage steps of size M. In other embodiments, an immediately succeeding (i.e., next) ramp voltage ends at a different voltage than that which an immediately preceding (i.e., prior) ramp begins. In other embodiments, the starting voltages and ending voltages of the series of ramp voltages include all quantization levels of the predetermined number of bits.

In other embodiments, repeatedly sampling the analog signal at a resolution that is less than that which is defined by the predetermined number of bits comprises repeatedly comparing the analog signal to a series of ramp voltages and repeatedly identifying a lower resolution digital value when the ramp voltage corresponds to the analog signal. Summing may then take place by summing the lower resolution digital values that are identified. In still other embodiments, sums of the analog signal and the series of ramp voltages may be compared to a reference voltage. In yet other embodiments, repeatedly comparing the analog signal to the series of ramp voltages may be performed while accounting for offsets. In yet other embodiments, a series of ramp voltages having a total of M ramp-up and ramp-down voltages may be generated wherein the ramp voltages increase or decrease per unit time by M times a voltage corresponding to the predetermined quantization level.

Image sensing methods according to other embodiments of the present invention may include generating an analog signal in response to electromagnetic energy, such as light, incident on a sensing pixel from an image and converting the analog signal to a digital value having a predetermined number of bits that define predetermined quantization levels. Conversion may take place by repeatedly sampling the analog signal at a resolution that is less than that which is defined by the predetermined number of bits, such that the repeated sampling includes the predetermined quantization levels of the predetermined number of bits, to obtained a plurality of lower resolution sampling results. The plurality of lower resolution sampling results are summed, to obtain the digital value having the predetermined number of bits. In some embodiments, repeatedly sampling comprises repeatedly sampling the analog signal using a series of staircase, constant slope and/or multiple slope ramp-up and ramp-down sampling voltages. In other embodiments, repeated sampling of the analog signal M times using $2^N/M$ quantization levels is performed, where N is the predetermined number of bits, and the quantization levels among the repeated samplings are offset from one another. Any or all of the other embodiments described herein may be used in an ADC/method that is used with an image sensor/method.

Methods of converting an analog signal to a digital value having a predetermined number of bits according to other embodiments of the present invention include repeatedly converting an analog signal to a digital value having fewer than the predetermined number of bits, to obtain a plurality of digital values having fewer than the predetermined number of bits. The plurality of digital values having fewer than the predetermined number of bits are summed to obtain the digital value having the predetermined number of bits.

Analog-to-digital converters for converting an analog signal to a digital value having a predetermined number of bits that define a predetermined quantization step, according to some embodiments of the invention, include a ramp generator, a comparator and a counter. The ramp generator is configured to generate a series of ramp voltages having at least one ramp-up and at least one ramp-down voltage, wherein the ramp-up and ramp-down voltages increase or decrease per unit time by a multiple, greater than one, of the predetermined quantization step. The comparator is configured to repeatedly compare the analog signal to the series of ramp voltages to identify a plurality of times when the at least one ramp-up voltage and the at least one ramp-down voltage correspond to the analog signal. The counter is responsive to the comparator and is configured to repeatedly sum digital values of the units of time for the plurality of times when the at least one ramp-up voltage and the at least one ramp-down voltage correspond to the analog signal, to obtain the digital value. In some embodiments, the ramp generator is further configured to generate at least one second ramp voltage, the comparator is further configured to compare the at least one second ramp voltage to an offset voltage to identify at least one time when the at least one second ramp voltage corresponds to the offset voltage and the counter is configured to subtract out a digital value of the at least one time when the at least one second ramp voltage corresponds to the offset voltage. Offset compensation thereby may be obtained. Any or all of the embodiments described herein may also be used in these ADCs and/or corresponding methods, and may also be used with an image sensor/method.

BRIEF DESCRIPTION OF THE DRAWINGS

FIG. 7 illustrates pseudo-multiple sampling according to other embodiments of the present invention.

FIG. 8 illustrates pseudo-multiple sampling according to yet other embodiments of the present invention.

DETAILED DESCRIPTION OF THE INVENTION

Figure 1:
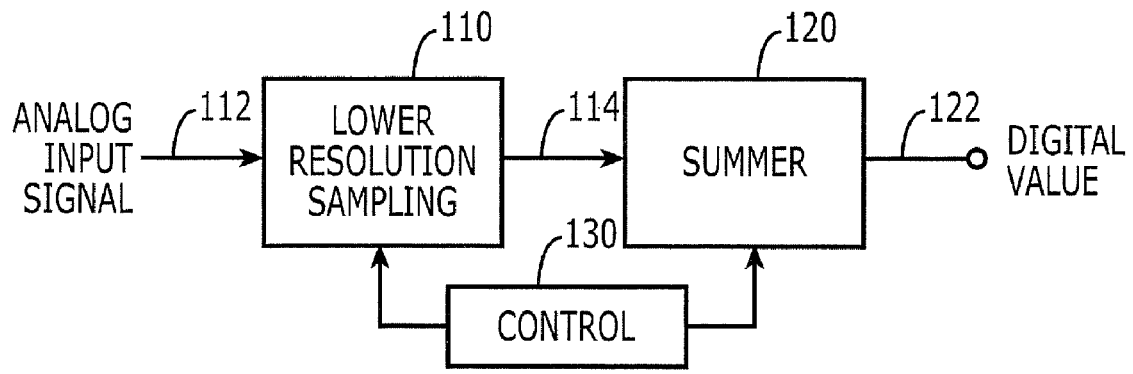
FIG. 1 is a block diagram of analog-to-digital conversion systems, methods and devices according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "on," "connected to", "coupled to" or "responsive to" another element (and variants thereof), it can be directly on, connected, coupled or responsive to the other element or intervening elements may be present. In contrast, when an element is referred to as being "directly on," "directly connected to", "directly coupled to" or "directly responsive to" another element (and variants thereof), there are no intervening elements present. Like reference numerals refer to like elements throughout. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" or "horizontal" and "column" or "vertical" indicate two relative non-parallel directions that may be orthogonal to one another. However, these terms also are intended to encompass different orientations.

The present invention is described in part below with reference to block diagrams and flowcharts of methods, systems and computer program products according to embodiments of the invention. It will be understood that a block of the block diagrams or flowcharts, and combinations of blocks in the block diagrams or flowcharts, may be implemented at least in part by computer program instructions. These computer program instructions may be provided to one or more enterprise, application, personal, pervasive and/or embedded computer systems, such that the instructions, which execute via the computer system(s) create means, modules, devices or methods for implementing the functions/acts specified in the block diagram block or blocks. Combinations of general purpose computer systems and/or special purpose hardware also may be used in other embodiments.

These computer program instructions may also be stored in memory of the computer system(s) that can direct the computer system(s) to function in a particular manner, such that the instructions stored in the memory produce an article of manufacture including computer-readable program code which implements the functions/acts specified in block or blocks. The computer program instructions may also be loaded into the computer system(s) to cause a series of operational steps to be performed by the computer system(s) to produce a computer implemented process such that the instructions which execute on the processor provide steps for implementing the functions/acts specified in the block or blocks. Accordingly, a given block or blocks of the block diagrams and/or flowcharts provides support for methods, computer program products and/or systems (structural and/or means-plus-function).

It should also be noted that in some alternate implementations, the functions/acts noted in the flowcharts may occur out of the order noted in the flowcharts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks. It will also be understood that, in many systems that are already equipped with some form of microprocessor-based computational capability, the blocks of the block diagram may be embedded within operating and/or application programs that execute on the microprocessor.

FIG. 1 is a block diagram of analog-to-digital conversion systems, methods and devices according to some embodiments of present invention. As shown in FIG. 1, these embodiments convert an analog input signal 112 into a digital value 122 having a predetermined number of bits that define predetermined quantization levels. As shown at FIG. 1, sampling is performed at Block 110 at a resolution that is less than that which is defined by the predetermined number of bits of the digital value 122. This resolution that is less than that which is defined by the predetermined number of bits may be referred to herein as a "lower resolution". The repeated lower resolution sampling of Block 110 obtains a plurality of lower resolution sampling results 114. A controller 130 is configured to control the sampling 110 to provide the repeated sampling of the analog signal at 112 at a resolution that is less than the predetermined number of bits. In some embodiments, the repeated sampling is configured so that the repeated sampling includes the predetermined quantization levels of the predetermined number of bits. Stated differently, in some embodiments, the repeated sampling is performed a sufficient number of times such that all quantization levels of the predetermined number of bits are included in the repeated sampling. A summer 120 is responsive to the lower resolution sampling Block 110 and the controller 130 to sum the plurality of lower resolution sampling results to obtain the digital value 122 having the predetermined number of bits.

Figure 2:
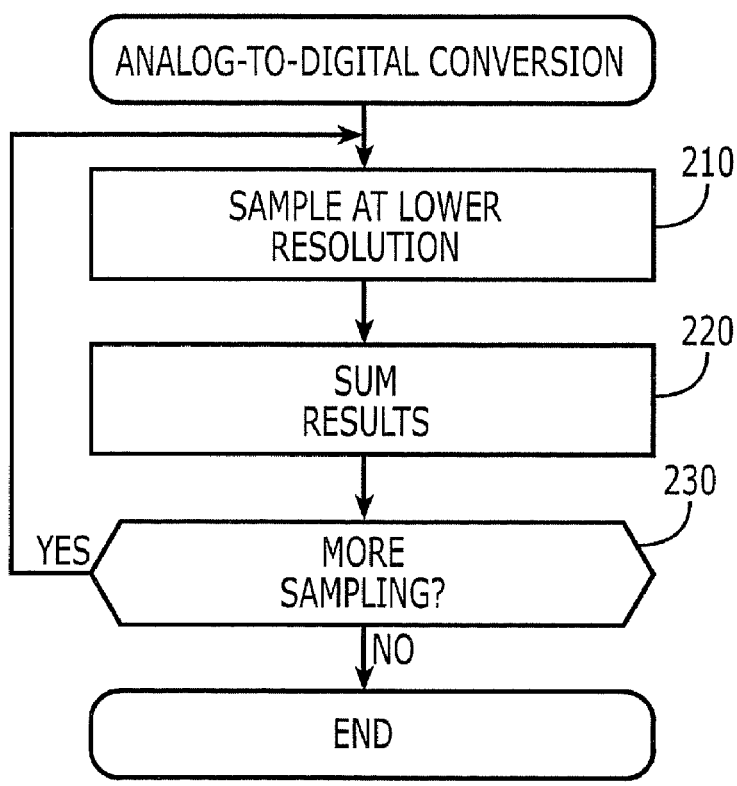
FIG. 2 is a flowchart of operations that may be performed to convert an analog signal to a digital value according to various embodiments of the present invention.

FIG. 2 is a flowchart of operations that may be performed to convert an analog signal to a digital value having a predetermined number of bits that define predetermined quantization levels, according to various embodiments of the invention. As shown in FIG. 2, at Block 210, sampling of the analog signal is performed at a resolution that is less than that which is defined by the predetermined number of bits, such that repeated sampling includes the predetermined quantization levels of the predetermined number of bits. A plurality of lower resolution sampling results are obtained. At Block 220, the results are summed. At Block 230, a determination is made as to whether more sampling is needed and if so, operations of Blocks 210 and 220 are repeated. Accordingly, repeated sampling and summing are thereby provided.

Many detailed embodiments of repeated sampling and summing according to various embodiments of the present invention will be described below. In general, however, the predetermined quantization levels may be equally spaced apart and/or unequally spaced apart. Moreover, during the repeated sampling of Blocks 110/210, the quantization levels that are used may be offset from one another. Moreover, the resolution at which sampling is performed at Blocks 110/210 may be a function of the number of times that sampling is performed at Blocks 130/230. In particular, if it is desired to sample the signal M times and the predetermined number of bits is N then the lower resolution of the sampling performed at Blocks 110/210 may use $2^N/M$ quantization levels. Moreover, in some embodiments, quantization levels may be offset from one another by one. In other embodiments, they may be offset by at least a quantization level that corresponds to a least significant bit of the digital value.

Figure 3:
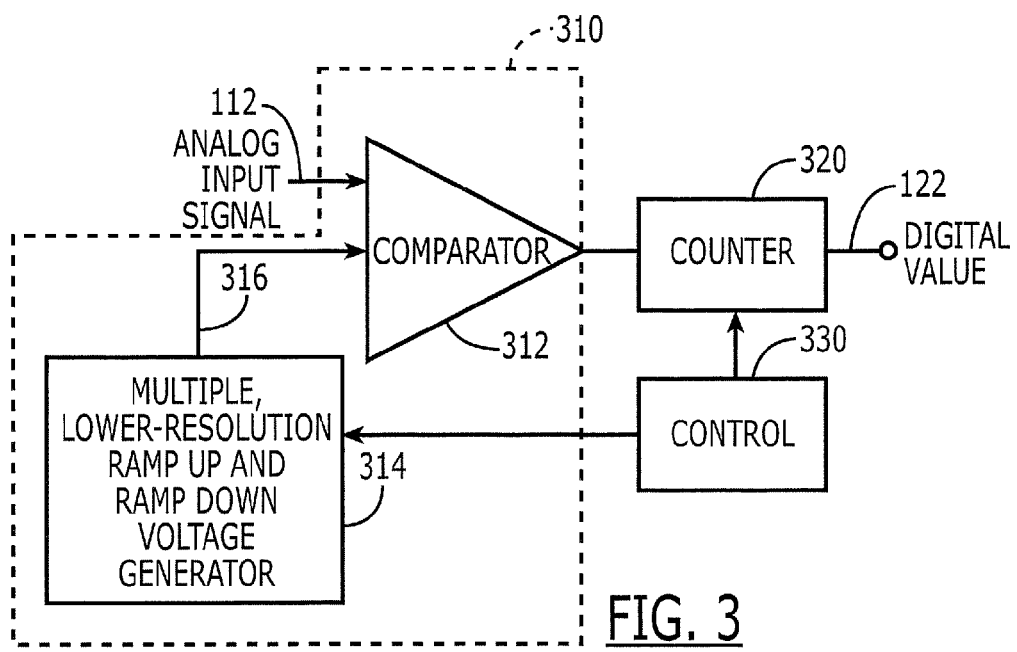
FIG. 3 is a block diagram of analog-to-digital conversion systems, methods and devices according to other embodiments of the present invention.

FIG. 3 is a block diagram of analog-to-digital converters according to other embodiments of the present invention. In these embodiments, lower resolution sampling may be performed at Block 310 using a ramp generator 314 and a comparator 312. The ramp generator 314 may be configured to generate a series of ramp voltages having at least one ramp-up voltage and at least one ramp-down voltage, wherein the ramp-up voltage(s) and the ramp-down voltage(s) increase or decrease per unit time by a multiple, greater than one, of the predetermined quantization step, to thereby provide multiple, lower resolution, ramp-up and ramp-down voltages. The comparator 312 is configured to repeatedly compare the analog input signal 112 to the series of ramp voltages, to identify a plurality of times when the ramp-up voltage(s) and the ramp-down voltage(s) correspond to the analog signal. The summer 120 of previous embodiments may be embodied by a counter 320 that is responsive to the comparator 312 and that is configured to repeatedly sum digital values of the units of time of the plurality of times when the ramp-up voltage(s) and the ramp-down voltage(s) correspond to the analog signal, to obtain a digital value. A controller 330 may be used to synchronize the generation of the multiple, lower resolution ramp-up and ramp-down voltages by the generator 314 and the counting by the counter 320.

Accordingly, FIG. 3 illustrates embodiments of the present invention that can perform repeated sampling using a series of ramp-up and ramp-down sampling voltages. As will be described in more detail herein, the ramp-up and ramp-down voltages can comprise a series of staircase, constant slope and/or multiple slope (non-staircase) ramp-up and ramp-down sampling voltages. Moreover, in some embodiments, the analog signal is repeatedly sampled M times using $2^N/M$ quantization levels, by generating a series of ramp voltages having a total of M ramp-up and ramp-down voltages (e.g., M/2 ramp-up voltages and M/2 ramp-down voltages), wherein a respective ramp-up and ramp-down voltage includes $2^N/M$ ramp voltage steps of size M. In other embodiments, an immediately succeeding ramp (e.g., a next down ramp) ends at a different voltage than a voltage at which an immediately preceding ramp (e.g., a prior up ramp) begins. In still other embodiments, the starting voltages and ending voltages of the series of ramp voltages include all quantization levels of the predetermined number of bits. In yet other embodiments, the M ramp-up and ramp-down voltages increase or decrease per unit time by M times a voltage corresponding to the predetermined quantization level. Moreover, repeatedly sampling may be performed by repeatedly comparing the analog signal to the series of ramp voltages and repeatedly identifying a digital value when the ramp voltage corresponds to the analog signal. Summing may be performed by summing the digital values that are identified.

FIG. 3 illustrates still other embodiments of the present invention that convert an analog signal to a digital value having a predetermined number of bits by repeatedly converting the analog signal to a digital value having fewer than the predetermined number of bits, to obtain a plurality of digital values having fewer than the predetermined number of bits. The plurality of digital values having fewer than the predetermined number of bits are summed, to obtain the digital value having the predetermined number of bits.

Figure 4:
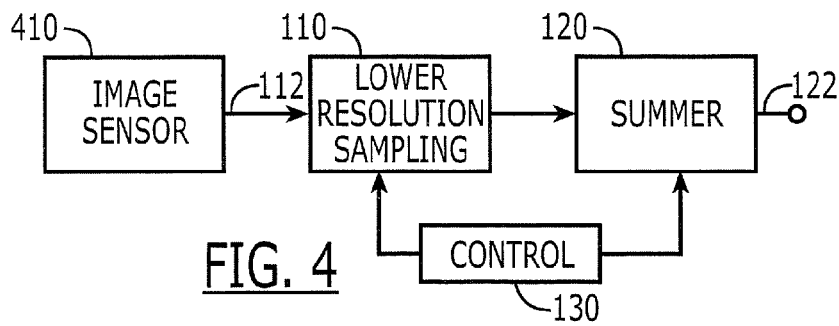
FIG. 4 is a block diagram of analog-to-digital conversion systems, methods and devices according to yet other embodiments of the present invention.
Figure 5:
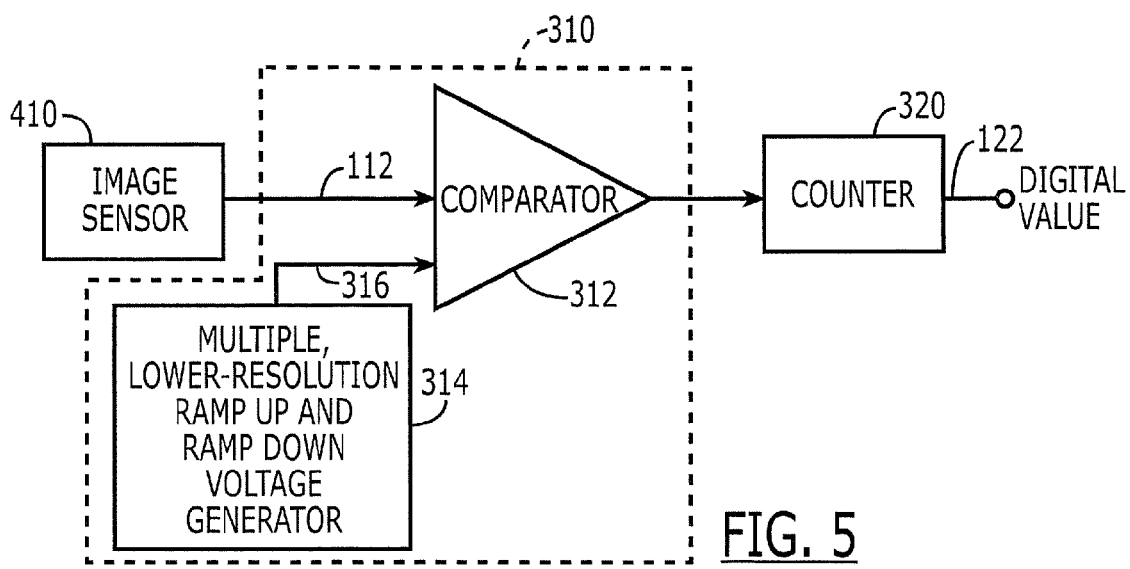
FIG. 5 is a block diagram of analog-to-digital conversion systems, methods and devices according to still other embodiments of the present invention.

FIGS. 4 and 5 are block diagrams of other embodiments of the present invention that correspond to FIGS. 1 and 3, respectively, but include an image sensor 410 that provides the analog input signal 112. The image sensor may comprise a CMOS image sensor, a charge coupled device, a photodiode and/or any other conventional image sensor.

Many embodiments of repeatedly sampling the analog signal at a resolution that is less than that which is defined by the predetermined number of bits to obtain a plurality of lower resolution sampling results and summing the plurality of lower resolution sampling results to obtain the digital value may be provided according to various embodiments of the present invention. Some embodiments will now be presented and will also be related to the block diagrams of FIGS. 3 and 5 wherein a multiple, lower resolution ramp-up and ramp-down voltage generator 314 is present.

Figure 6:
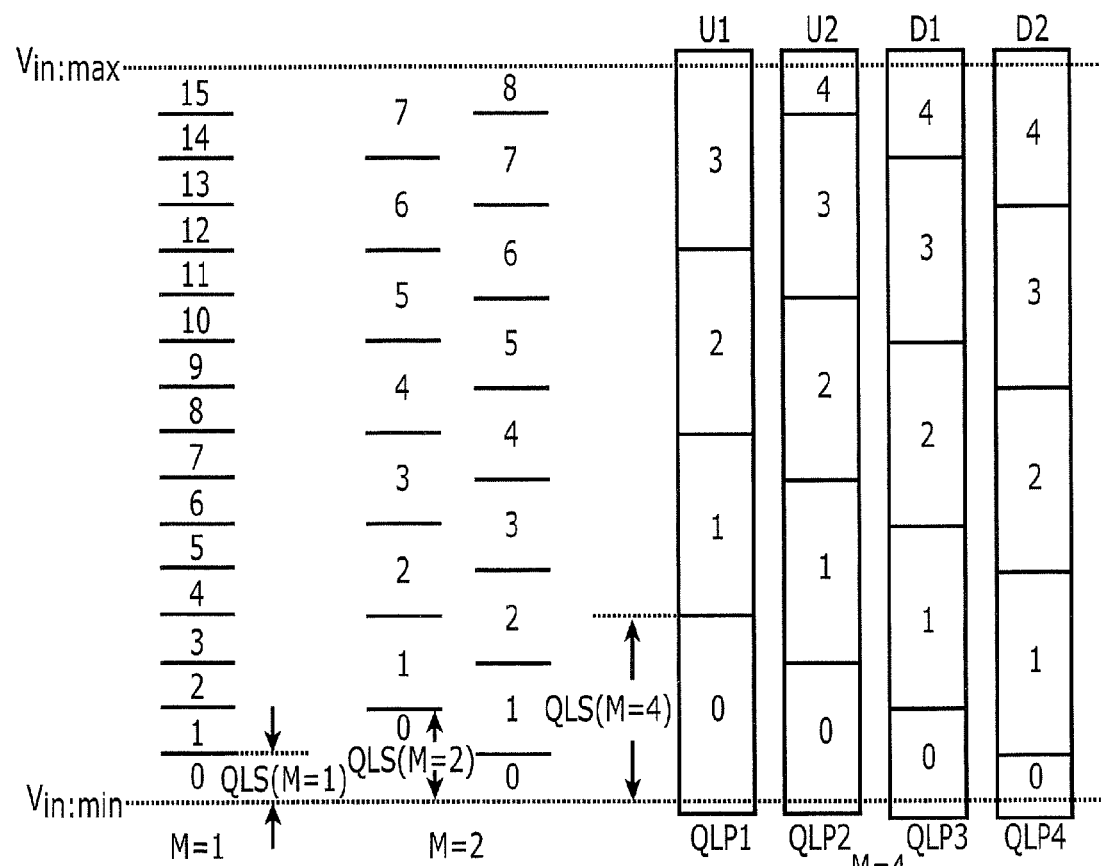
FIG. 6 illustrates pseudo-multiple sampling according to various embodiments of the present invention.

In particular, FIG. 6 illustrates M times of pseudo-multiple sampling to provide a digital signal with N bits resolution. The first (left) column M=1 illustrates conventional single sampling or conventional multiple sampling using N bit resolution at each time. For purposes of illustration in FIG. 6, N=4, i.e. 4 bit resolution, which provides $2^4$ or 16 Quantization Level Steps (QLS). As shown in the M=1 (first) column, a signal may be sampled once at 4 bit quantization. Moreover, in conventional multiple sampling, the signal may be sampled multiple times at N bits resolution and an average value may be taken.

The center columns of FIG. 6, M=2, illustrate pseudo-multiple sampling according to some embodiments of the present invention, wherein two samples are performed (M=2) using $2^N/M$ or 8 quantization levels, wherein there is an offset of 1 bit between the 2 quantization levels. Stated differently, the two quantization levels are offset by at least a quantization level that corresponds to a Least Significant Bit (LSB) of the digital value. Similarly, the right columns of FIG. 6 (M=4) illustrate 4 times multiple sampling and quantization levels of $2^4/4$ or 4 quantization levels. Again, there is an offset of 1 bit between the quantization levels among the samples. For the middle columns (M=2) and the right columns (M=4), the final output is the sum of each sampling result. The right column of FIG. 6 (M=4) also shows 4 ramp voltages U1, U2, D1 and D2 signifying a first up-ramp, a second up-ramp, a first down-ramp and a second down-ramp, respectively, that may be provided to perform multiple sampling at reduced resolution according to various embodiments of the present invention. These ramps will be described in more detail in FIG. 8B. Since the output noise is generally uncorrelated, the output noise of each A/D conversion can be decreased to 1/M levels. Reduced output noise may thereby be provided by embodiments of the present invention in a manner similar to multiple sampling. However, storage of the intermediate results and an averaging circuit need not be provided.

FIG. 7 illustrates examples of results for conventional multiple sampling and for pseudo-multiple sampling according to various other embodiments of the present invention. In particular, FIG. 7 illustrates results of converting an Analog Input 1 and an Analog Input 2 to digital, wherein the Analog Input 1 corresponds to 13 digital, and the Analog Input 2 corresponds to 4 digital. Referring to the left-hand column for M=1, which illustrates conventional single sampling or conventional multiple sampling, a binary number of N bits has $2^N$ quantization levels. Thus, in FIG. 7, N=4, so that the values of 0-15 can be covered. Assuming an input signal range of 0-15V is provided, the number of quantization levels is 16 so that the Quantization Level Step (QLS) is 1 volt for M=1. Using the 16 quantization levels, the Analog Input 1 is converted to an Output Code 1 of 13 and the Analog Input 2 is converted to an Output Code 2 of 4.

Referring to the middle columns of FIG. 7, if the number of pseudosamples is 2 (M=2), then 16/2 or 8 quantization levels are used for each sample, with the quantization levels being offset from one another by the value of 1 bit (i.e., by 1 volt in the present example). The results of the two samples are summed so that for Output Code 1 the sum of 6 plus 7 yields the correct value of 13 and for Output Code 2 the sum of 2 plus 2 yields the correct value of 4.

Finally, referring to the right columns of FIG. 7, for 4 times, pseudo-sampling (M=4), 4 quantization level patterns are used, referred to in FIG. 7 as QLP1-QLP4. As shown in FIG. 7, QLP1-QLP4 have 4V differences therebetween, illustrating a lower resolution. Moreover, the voltage difference between QLP1 and QLP2 is 1V, the voltage difference between QLP1 and QLP3 is 2V, and the voltage difference between QLP1 and QLP4 is 3V. It will also be noted that the sequence of sampling need not matter as long as the patterns are different from each other. The bottom right of FIG. 7 also illustrates that the correct output code is received. In particular, four times lower resolution sampling of input codes of Analog Input 1 provides Output Code 1 of 3+3+3+4 or 13 and four times lower resolution sampling of Analog Input 2 provides Output Code 2 of 1+1+1+1 or 4.

Embodiments of FIG. 7 used repeated sampling at powers of 2 (i.e., M=2 and M=4). However, M can be any integer and need not be a power of 2. For example, FIG. 8 illustrates M=2 and M=4 as was the case in FIG. 7, but also illustrates how the correct results are obtained for M=3 and M=5, using the same examples of analog inputs.

Figure 9A:
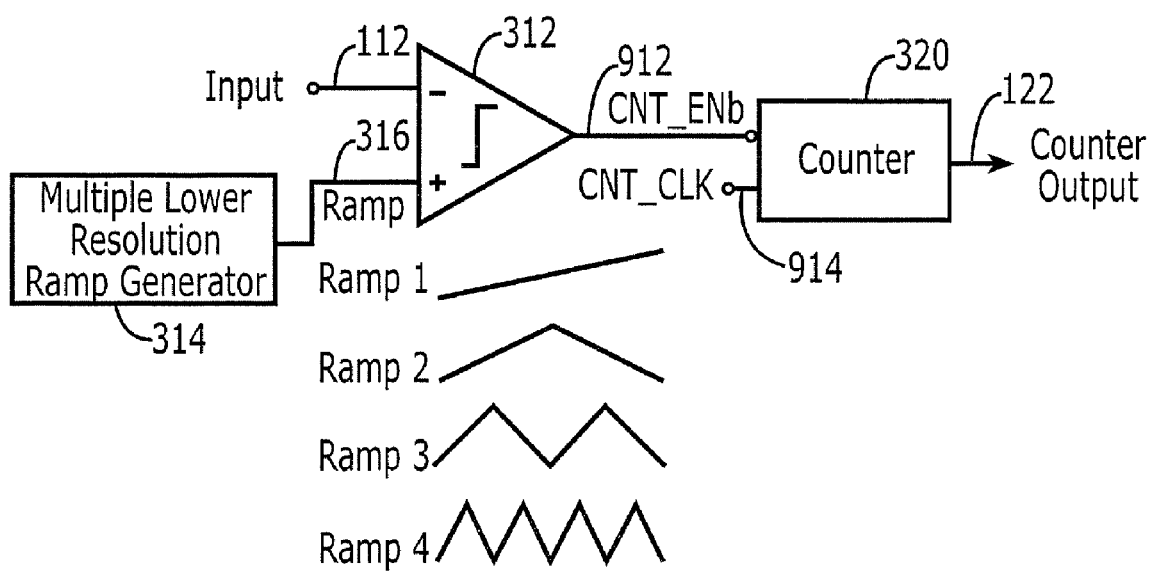
FIG. 9A is a block diagram of analog-to-digital conversion systems, methods and devices according to still other embodiments of the present invention.
Figure 9B:
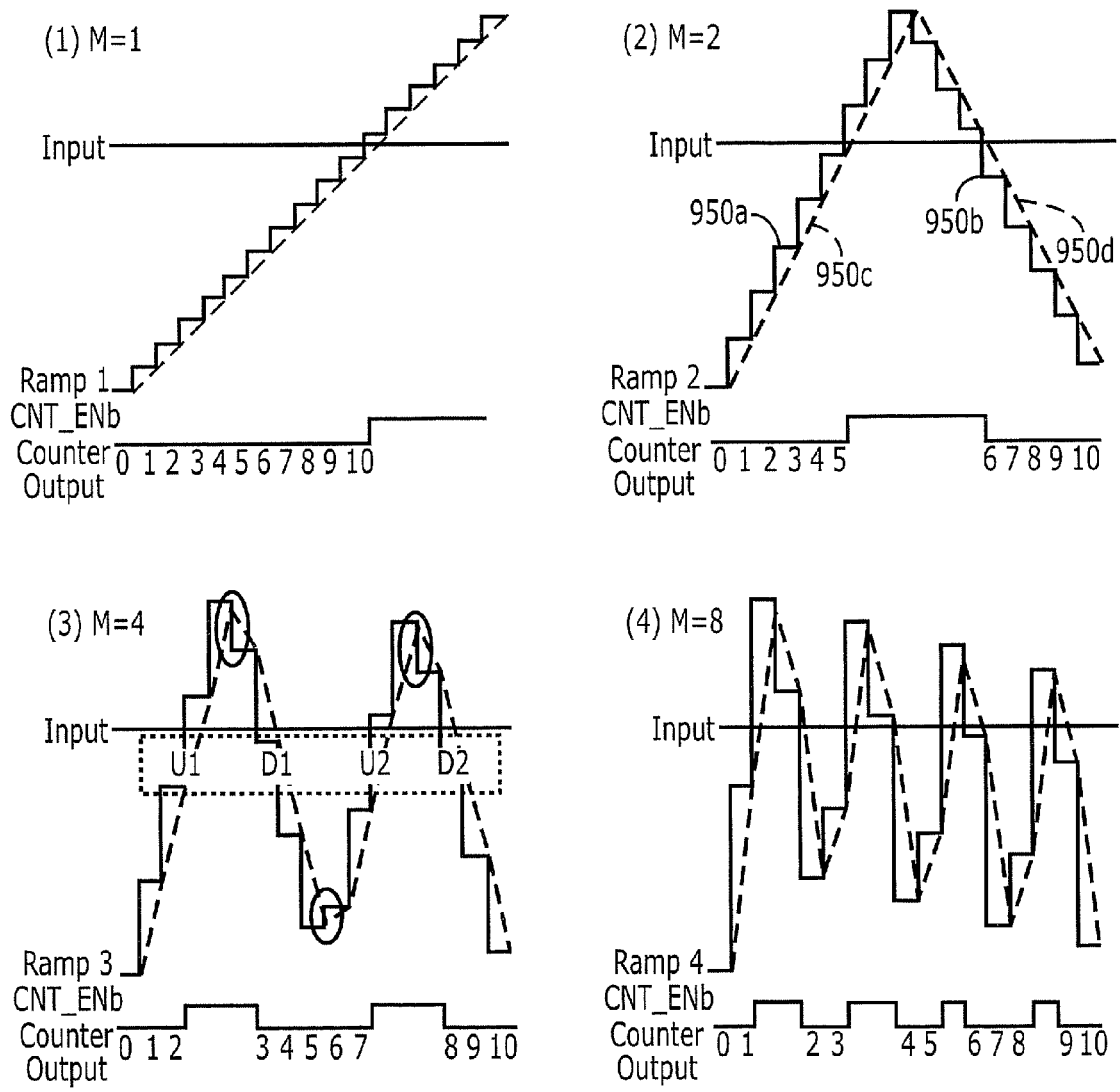
FIG. 9B (1)-(4) graphically illustrate ramp voltages according to various embodiments of the present invention.

FIGS. 9A and 9B illustrate and analog-to-digital converters using pseudo-multiple sampling according to various embodiments of the present invention. As shown in FIG. 9A, an analog-to-digital converter includes a multiple, lower resolution ramp generator 314, which may be embodied using a digital-to-analog converter. A ramp generator 314 generates multiple up and down ramps 316 that are applied to a comparator 312. The comparator 312 repeatedly compares the ramps 316 with the analog input signals 112 and provides a counter enable signal (CNT_ENb) 912 that is used to allow a counter 320 to count in response to a counter clock signal (CNT_CLK) 914 to produce a counter output of 122, which corresponds to a digital value having the predetermined number of bits. Various ramps are also illustrated in FIG. 9A. Ramp1 is a conventional sawtooth ramp that may be used when a single sample (M=1) is performed or when conventional multiple sampling with averaging is performed. FIG. 9B (1) illustrates the sampling for M=1 illustrating the sawtooth ramp, the counter enable signal and the counter output of 10. An equivalent constant slope ramp is shown as a dashed line.

The second ramp of FIG. 9A, referred to as Ramp2, corresponds to pseudo-multiple sampling with M=2 and 4 bits of resolution. Accordingly, one up-ramp and one down-ramp is used as shown in FIG. 9B (2). Samples of 5 and 5 are obtained so that the counter output of 10 is also provided. As also shown in FIG. 9B (2), the up-ramp and down-ramp differ by one quantization level therebetween.

FIG. 9B (3) shows pseudo-multiple sampling four times, corresponding to Ramp3 of FIG. 9A. The up and down ramps U1, D1, U2 and D2 correspond to the up and down ramps of FIG. 6. As also shown, there is at least one least significant bit offset between adjacent ramps as shown by the circled offsets in FIG. 9B (3). The correct result of 10 is shown by the counter output. Finally, FIG. 9B (4) corresponds to Ramp4 of FIG. 9A where M=8. Again, the correct result of 10 is shown by the counter output.

Figure 10:
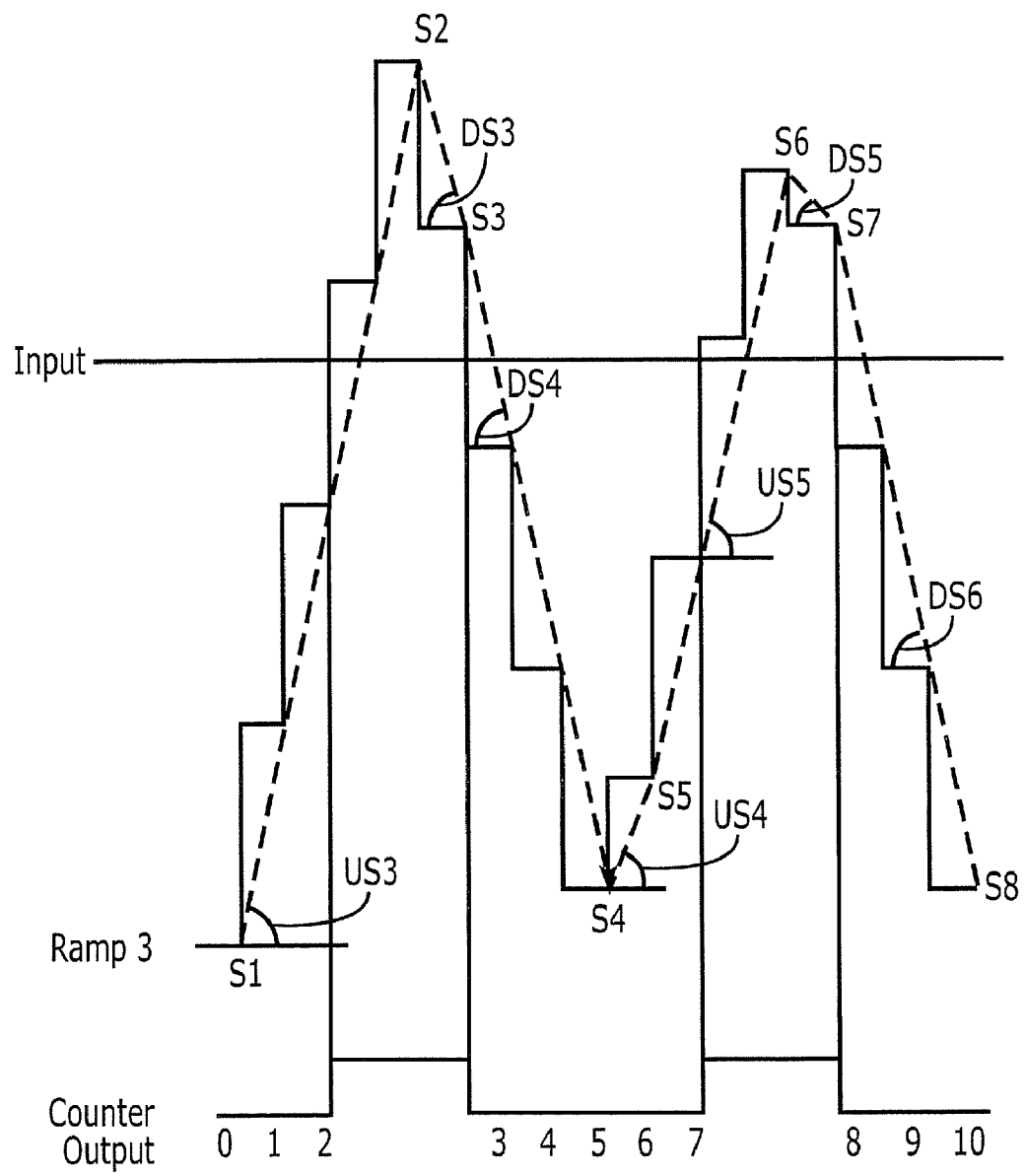
FIG. 10 graphically illustrates a series of ramp-up and ramp-down voltages that may be used according to various embodiments of the present invention.

It will also be understood by those having skill in the art that the ramp voltages 316 may be staircase voltages 950*a*, 950*b* having discrete levels or may be constant/multiple slope non-staircase ramps 950*c*, 950*d* as also illustrated by dashed lines. The ramps 950*c*, 950*d* may have a constant slope as shown by the up-ramp 950*c* of FIG. 9B or may have different slopes over portions thereof, as shown by the ramp 950*d*. In particular, down-ramp 950*d* includes two different slopes over two different portions thereof to accommodate the quantization level offset. Different slopes to accommodate different offsets are also shown in FIG. 10, where a single up slope US3 may be used in a given ramp or multiple slopes DS3 DS4, US4 US5, DS5, DS6 may be used in a given ramp. Note that FIG. 10 corresponds to embodiments of FIG. 9B (3), but illustrates the different slopes in more detail.

The series of ramp-up and ramp-down voltages that are used may vary considerably, in various embodiments of the present invention, as long as a total of M ramp-up and ramp-down voltages are used, where M is greater than one and the ramp voltages increase or decrease per unit time by a multiple, greater than one, of the quantization level. Stated differently, the ramp voltages increase or decrease more than one quantization level per clock cycle of the counter. For example, the counter clock signal 914 of FIG. 9A increases the counter output as shown in FIGS. 9B (2)-(4). In conventional multiple sampling, the staircase sawtooth ramp increases by the amount of the quantization level per unit time, as shown in FIG. 9B (1). In contrast, according to embodiments of the invention illustrated in FIGS. 9B (2)-(4), the ramp voltages increase or decrease per unit time (i.e., per unit of the counter clock) by a multiple, greater than one, of the quantization level.

FIGS. 11A-11F graphically illustrate some variations of ramp voltages that may be provided when 4 bit resolution (N=4) and repeated samples (M) are used. In FIGS. 11A-11E, staircase ramp voltages are shown (solid lines) along with constant slope and multiple slope non-staircase voltages (dashed lines).

Figure 11A:
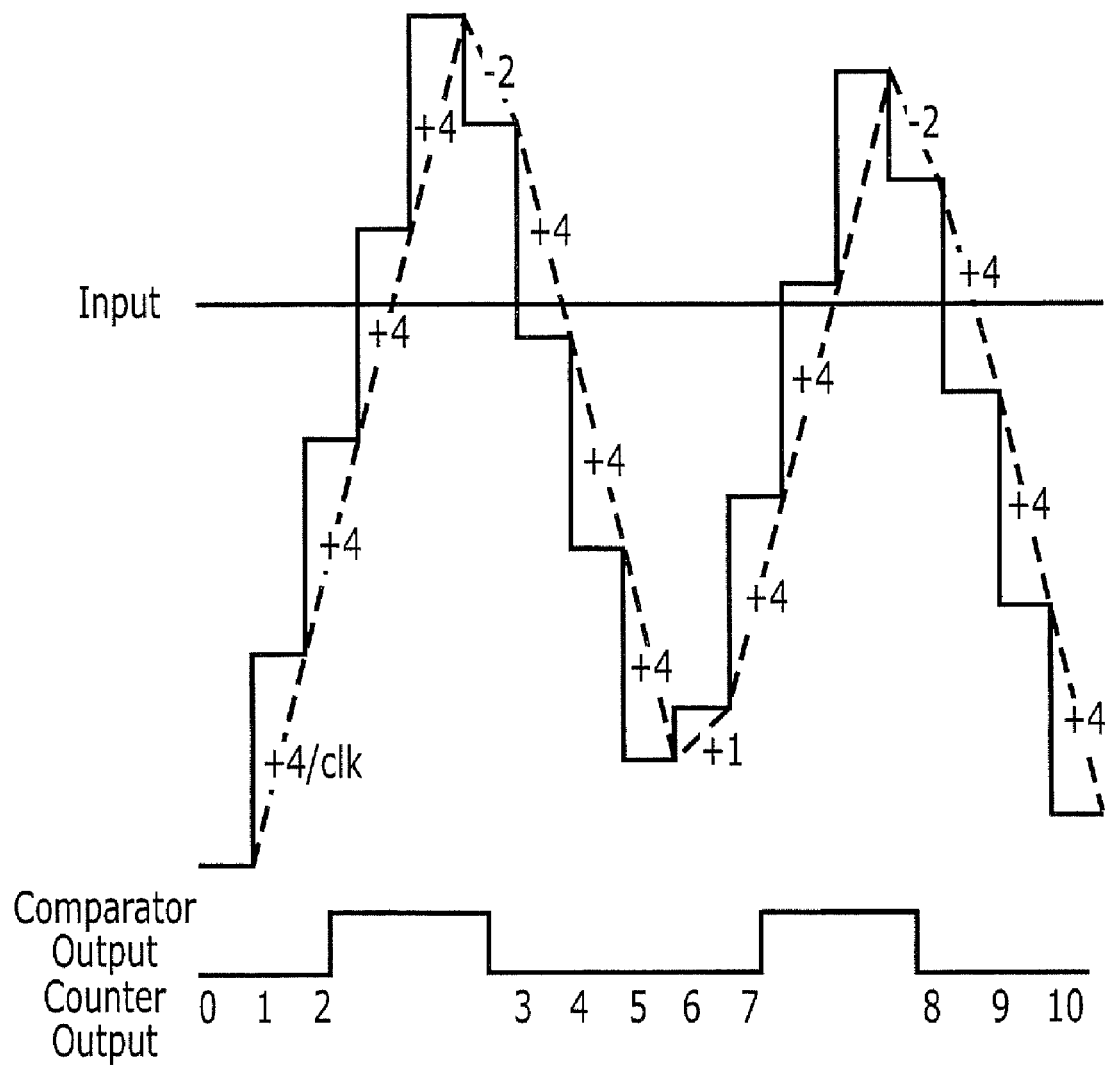
FIGS. 11A-11F graphically illustrate other series of ramp-up and ramp-down voltages that may be used according to various other embodiments of the present invention.

Referring now to FIG. 11A, M=4 and the ramp voltages shown have the same absolute slope except that the first clock in each direction changes in slope. The slope of every first clock rising (except for the first rising slope) is the same at M/2−1 or 1 and the slope of every first falling clock is also the same at −M/2.

Figure 11B:
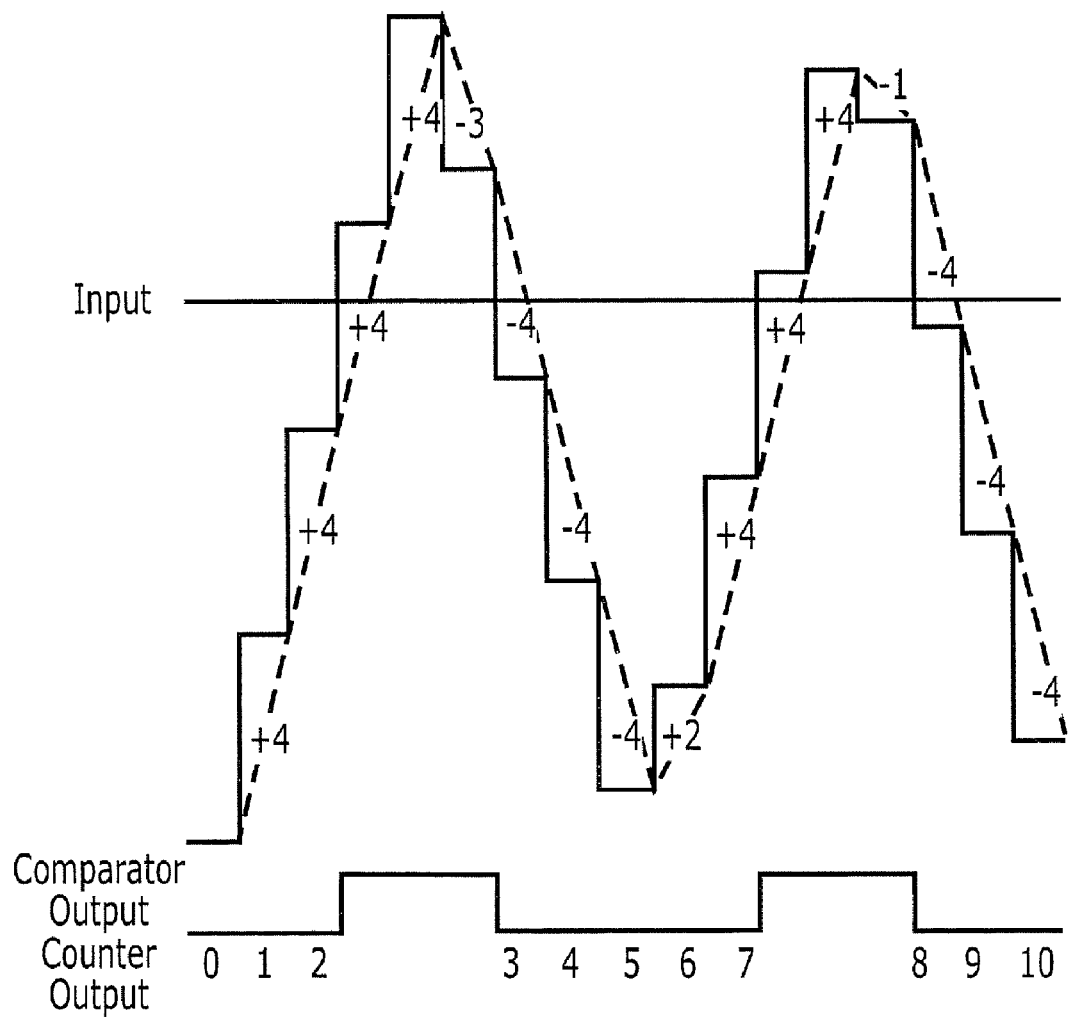

In FIG. 11B, M=4 and the same absolute slope also is provided, except that the first clock of each direction changes slope. In other words, the slope of every first clock of direction change is different. FIG. 11B illustrates that the order of quantization need not matter as far as obtaining accurate conversion results. Moreover, embodiments of FIG. 11B can have the same noise suppression capability as embodiments of FIG. 11A.

Figure 11C:
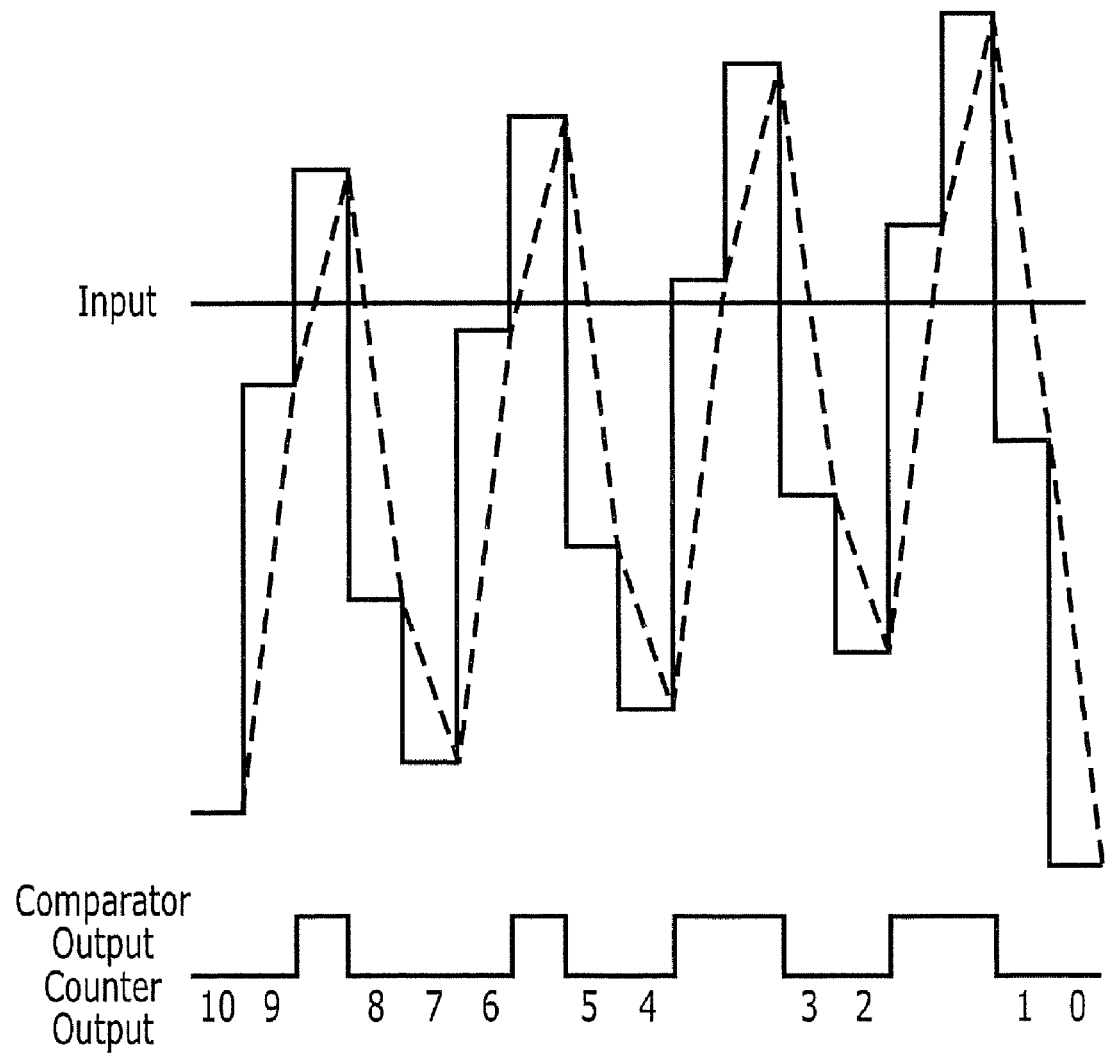

FIG. 11C illustrates that the ramp need not even start from the lowest quantization level. In FIG. 11C, M=8. Again, the order of the quantization need not matter.

Figure 11D:
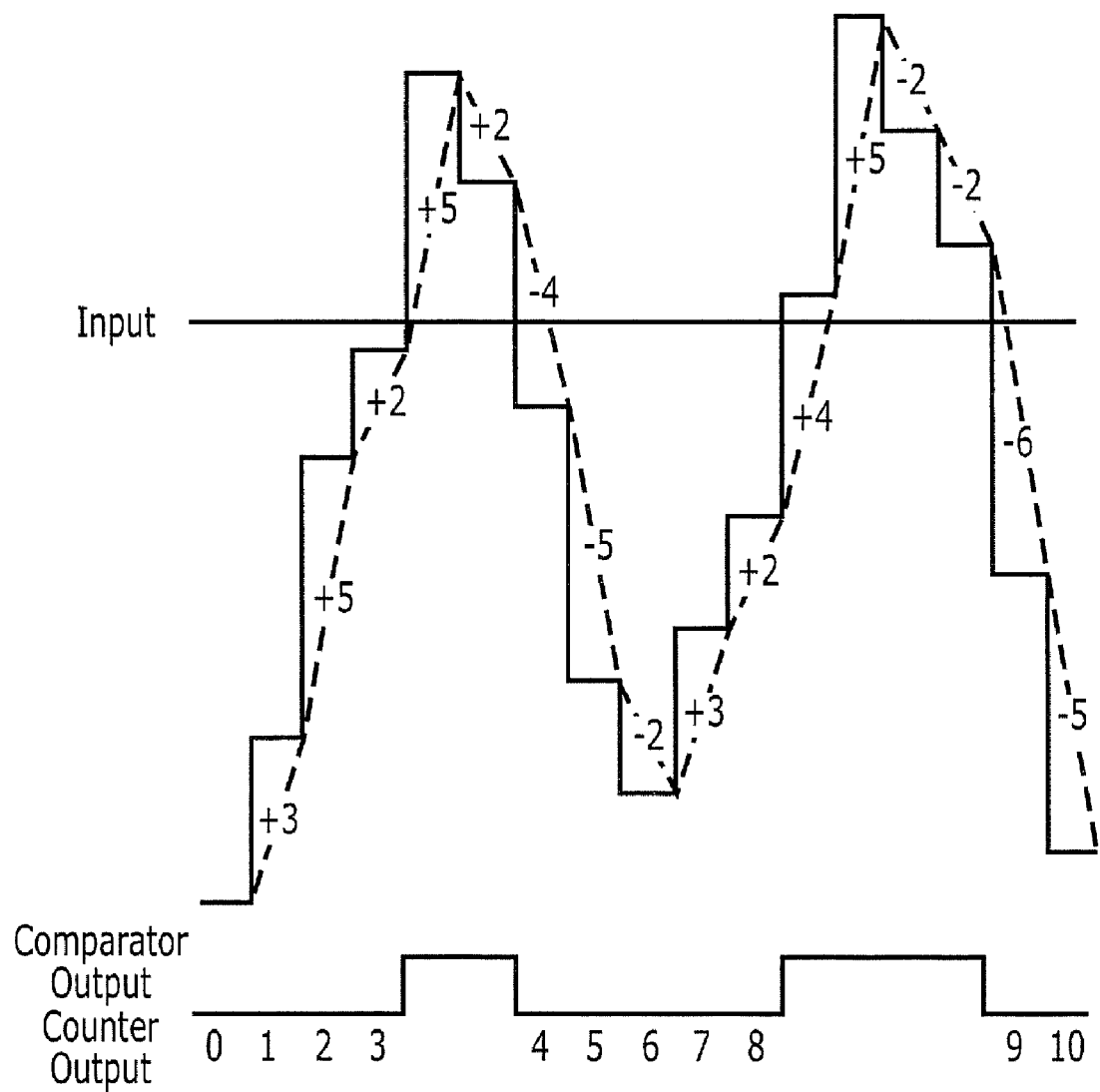

FIG. 11D illustrates random non-staircase slopes for each rising or falling ramp, but with the same period of rising and falling. In FIG. 11D, M=4. Embodiments of 11D may have poorer noise suppression compared to embodiments of FIG. 11A. However, as indicated at the bottom of FIG. 11D, the correct analog-to-digital conversion results are obtained.

Figure 11E:
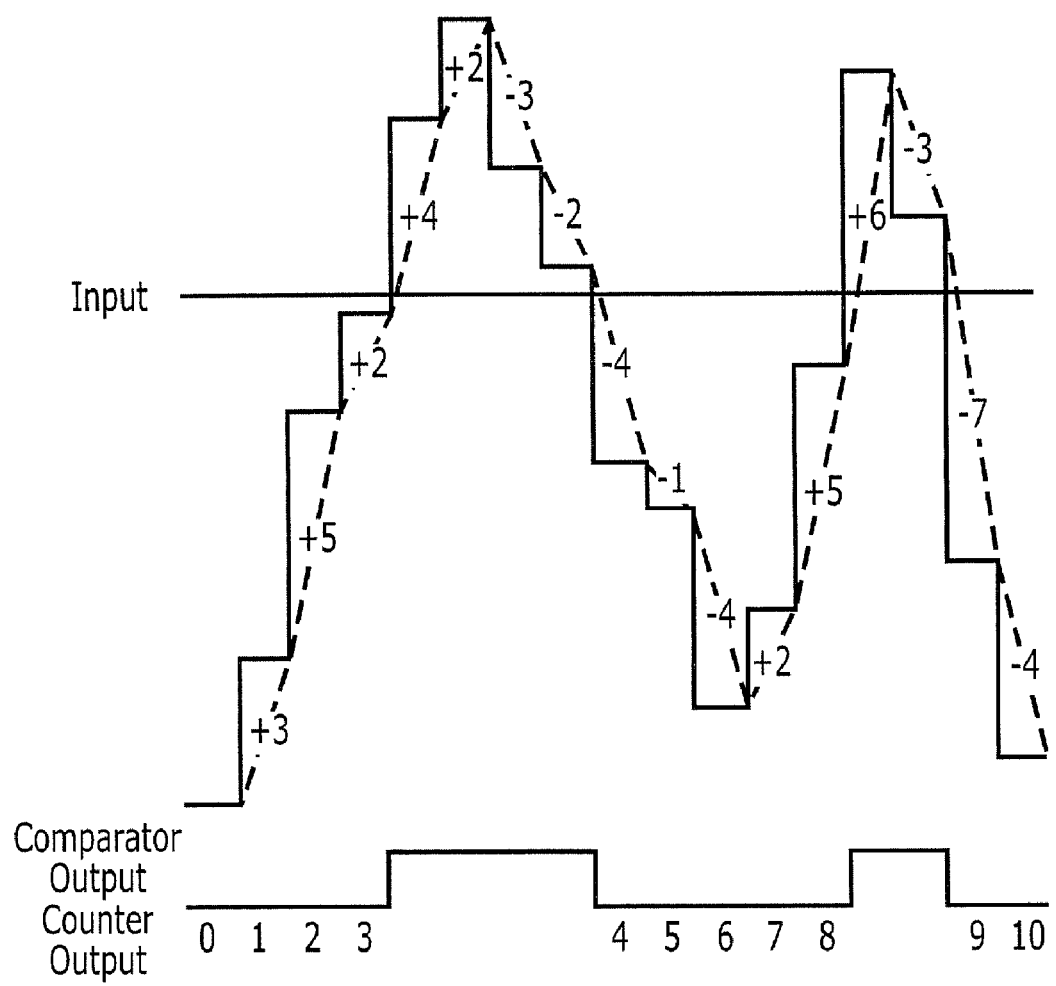

FIG. 11E illustrates random non-staircase slopes of each rising and falling ramp and different periods for each rising and falling ramp. Again, M=4. These embodiments may have relatively poorer noise suppression capability compared to FIG. 11A but the correct analog-to-digital conversion result is provided.

Figure 11F:
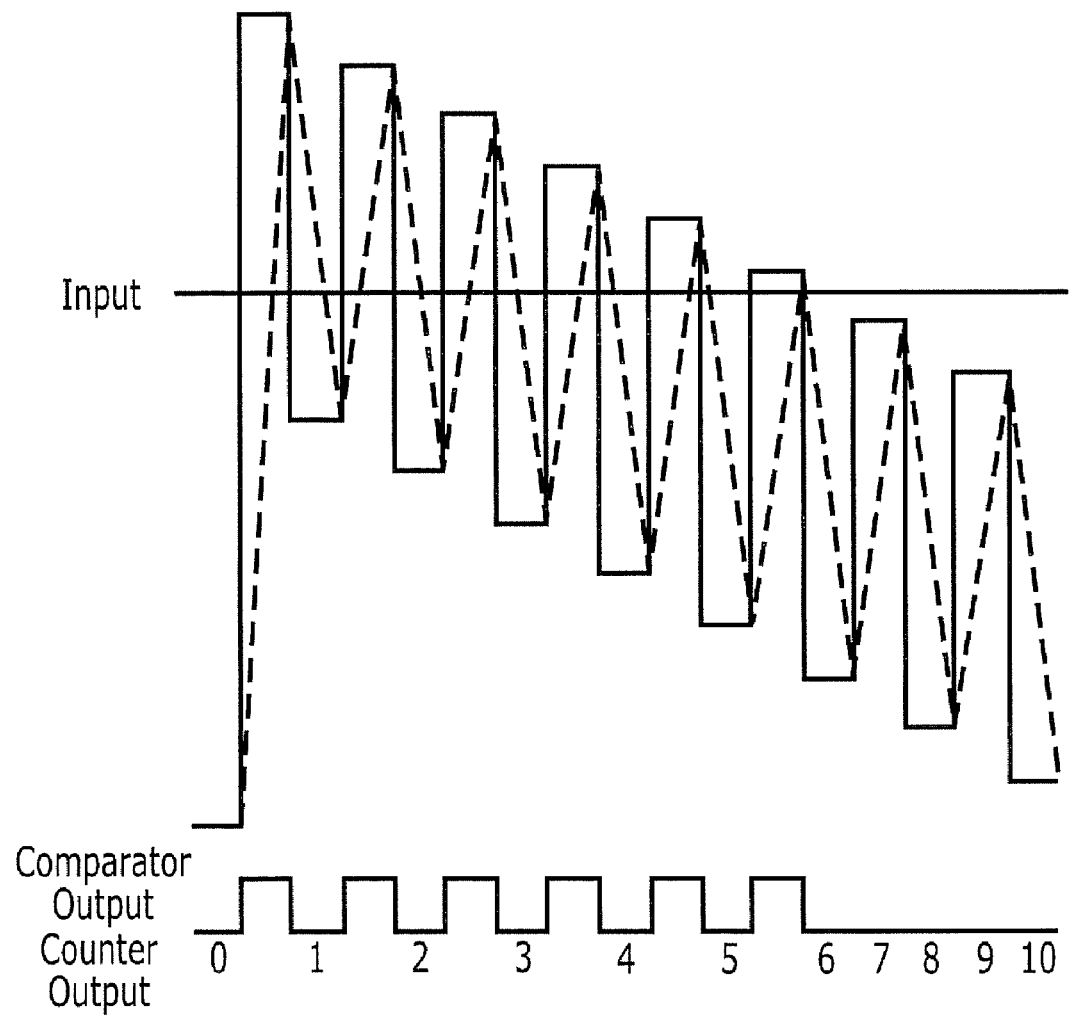

FIG. 11F illustrates another embodiment wherein M=16 so that the times of the multiple sampling are the same as the levels of quantization. Thus, in FIG. 11F, the quantization level of every rising and falling start covers all the quantization levels of the normal A/D conversion. Again, the correct result is obtained.

Accordingly, embodiments of FIGS. 11A-11F illustrate that the quantization levels may be equally spaced apart or unequally spaced apart, that the ramps can be a series of staircase, constant slope and/or multiple slope non-staircase ramp-up and ramp-down voltages, that the quantization levels can be offset from one another, that the quantization levels can be offset from one another by at least 1 bit, that M ramp voltages of step size M may be provided, that an immediately succeeding ramp can end at a different voltage than a voltage at which an immediately preceding ramp begins, that starting voltages and ending voltages of the series of ramp voltages can include all the quantization levels of the predetermined number of bits, and that the ramp voltages can increase or decrease per unit time by a multiple, greater than 1 of the quantization level size, according to various embodiments of the present invention.

Figure 12A:
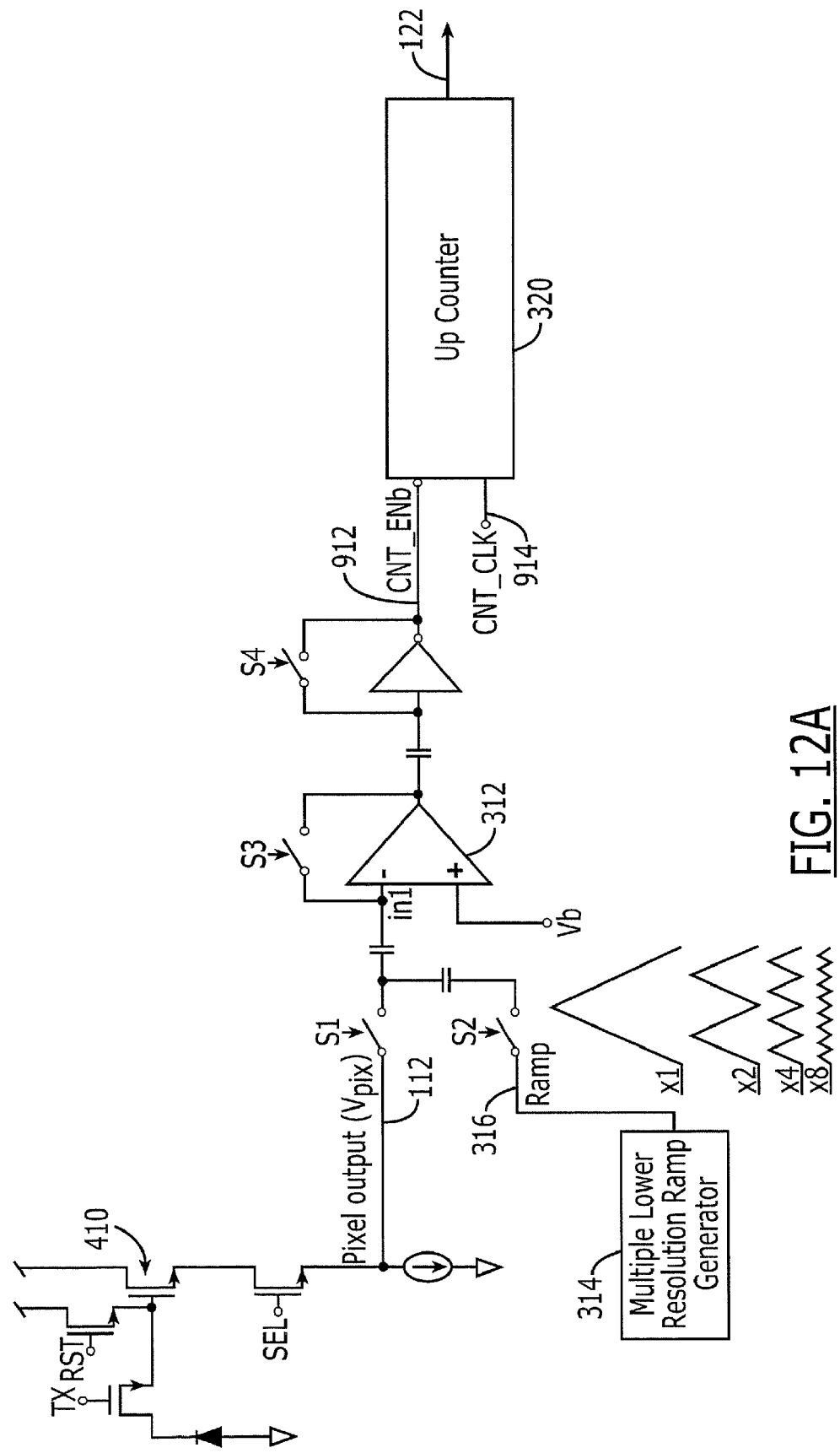
FIGS. 12A, 13A, 14A, 15A and 16A are combined circuit and block diagrams of pseudo-multiple sampling systems, devices and methods according to various embodiments of the present invention.
Figure 12B:
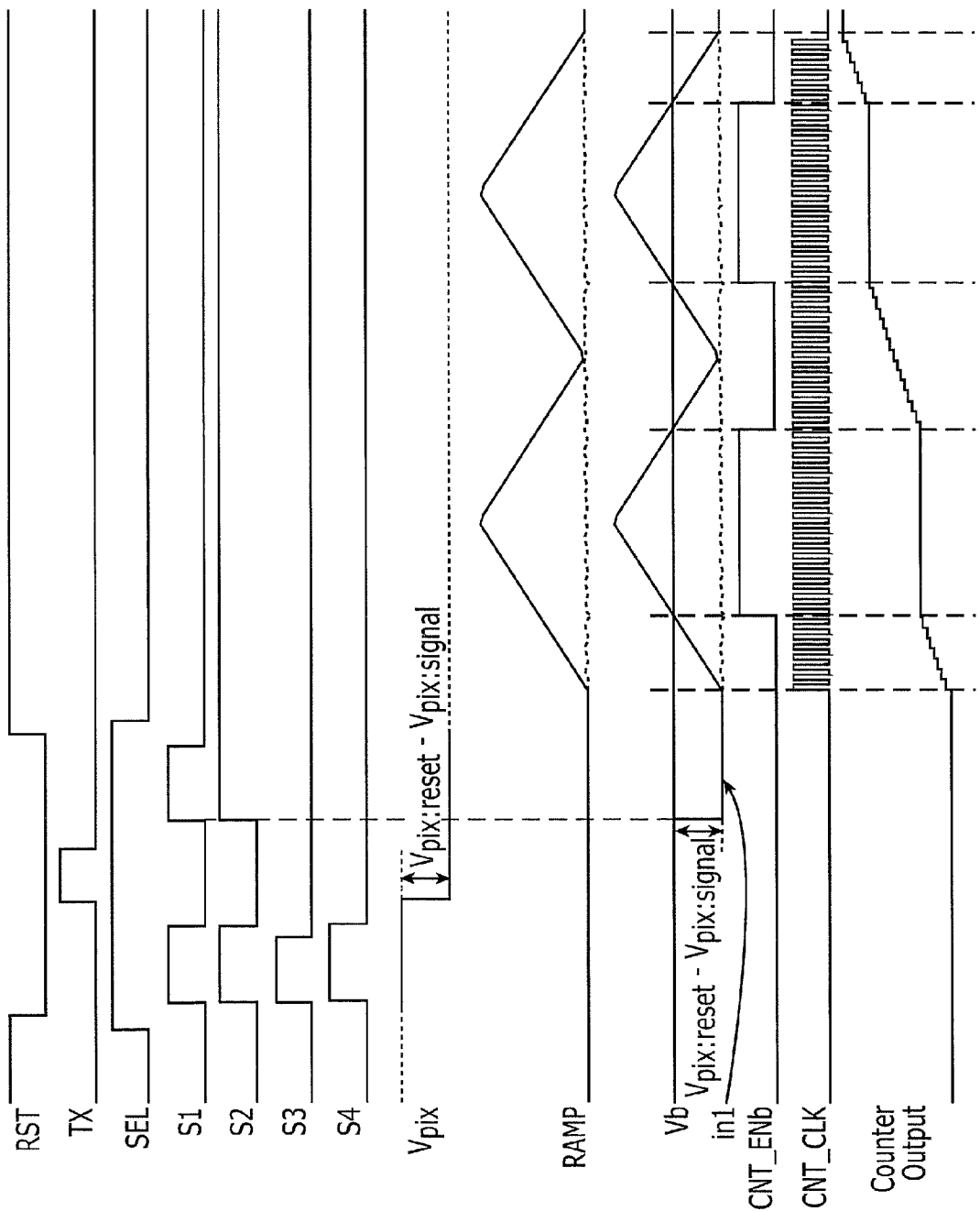
FIGS. 12B, 13B, 14B, 15B and 16B are timing diagrams illustrating operations of FIGS. 12A, 13A, 14A, 15A and 16A, respectively.

FIG. 12A is a combined circuit and block diagram of analog-to-digital converters according to other embodiments of the present invention and FIG. 12B is a timing diagram thereof. In embodiments of FIG. 12A, the analog signal 112 that is output from an image sensor pixel 410 is added to the multiple low resolution ramp voltages 316 generated by the multiple, low resolution ramp generator 314 and is compared to a bias voltage Vb in comparator 312. Embodiments of FIG. 12A that use a conventional sawtooth ramp generator are described in a publication entitled "*A 60 mW 10b CMOS Image Sensor With Column-To-Column FPN Reduction*" to Sugiki et al., *IEEE International Solid-State Circuits Conference* 108-109 (2000), the disclosure of which is hereby incorporated by reference in its entirety as if set forth fully herein. Accordingly, detailed operations need not be described herein. The timing diagram of FIG. 12B illustrates the ramp voltage ×2 for sampling with M=4.

Figure 13A:
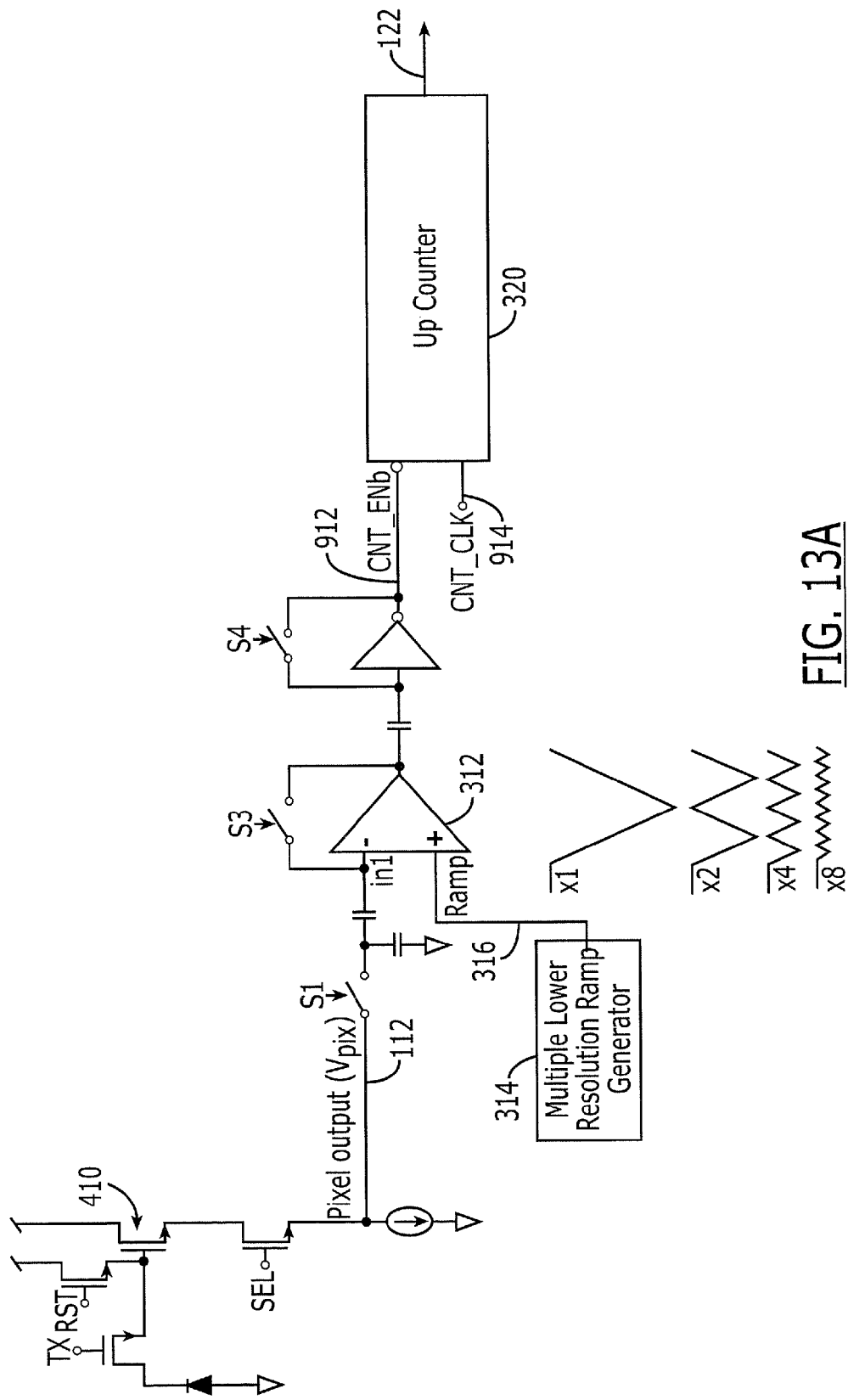
Figure 13B:
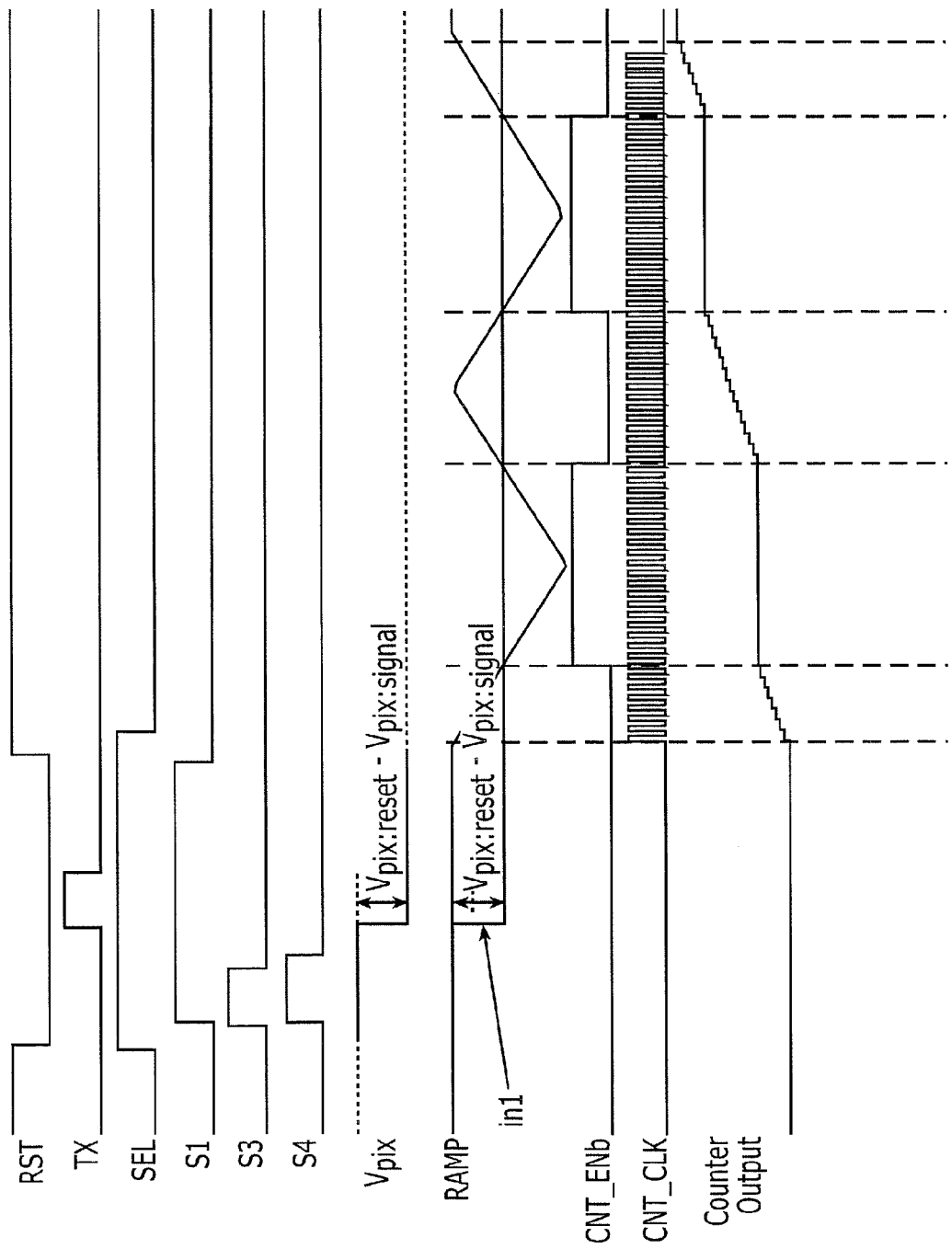

FIGS. 13A and 13B illustrate other embodiments wherein the ramp signal and the input signal are directly compared in the comparator. A down and up-ramp sequence ×2 is illustrated in the timing diagram of FIG. 13B. Embodiments of FIGS. 12A and 13A can reduce noise in the analog-to-digital converter itself and also can suppress noise due to power fluctuation.

Figure 14A:
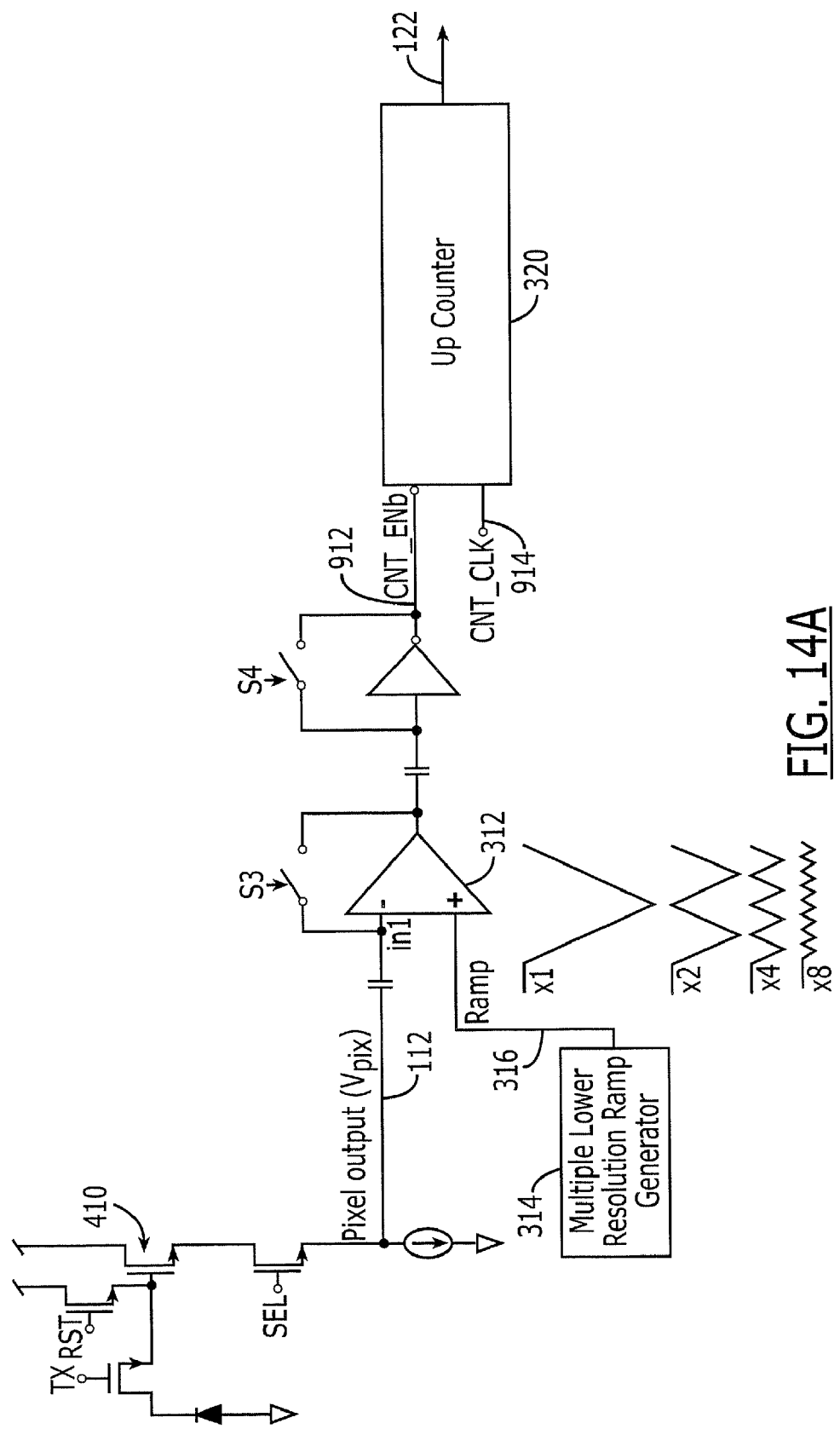
Figure 14B:
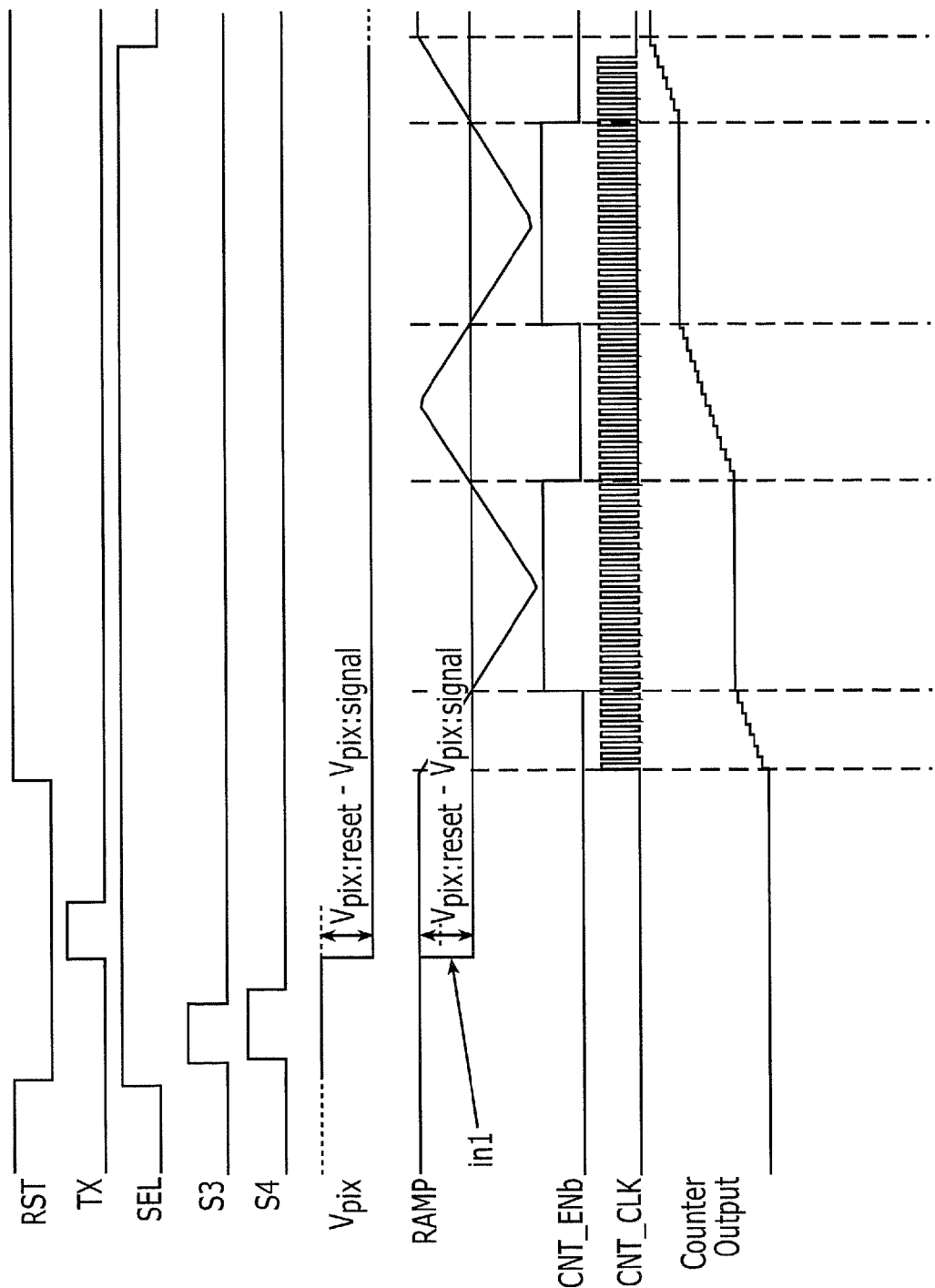

FIGS. 14A and 14B illustrate other embodiments that can reduce a signal phase's pixel noise as well by shunting the capacitor to ground and removing the S1 switch from the apparatus of FIG. 13A. Embodiments of FIGS. 14A and 14B can suppress the signal phase's pixel noise. However, the reset phase's pixel noise may not be suppressed by multiple sampling because the noise of the reset signal is sampled when switch S3 is closed.

Figure 15A:
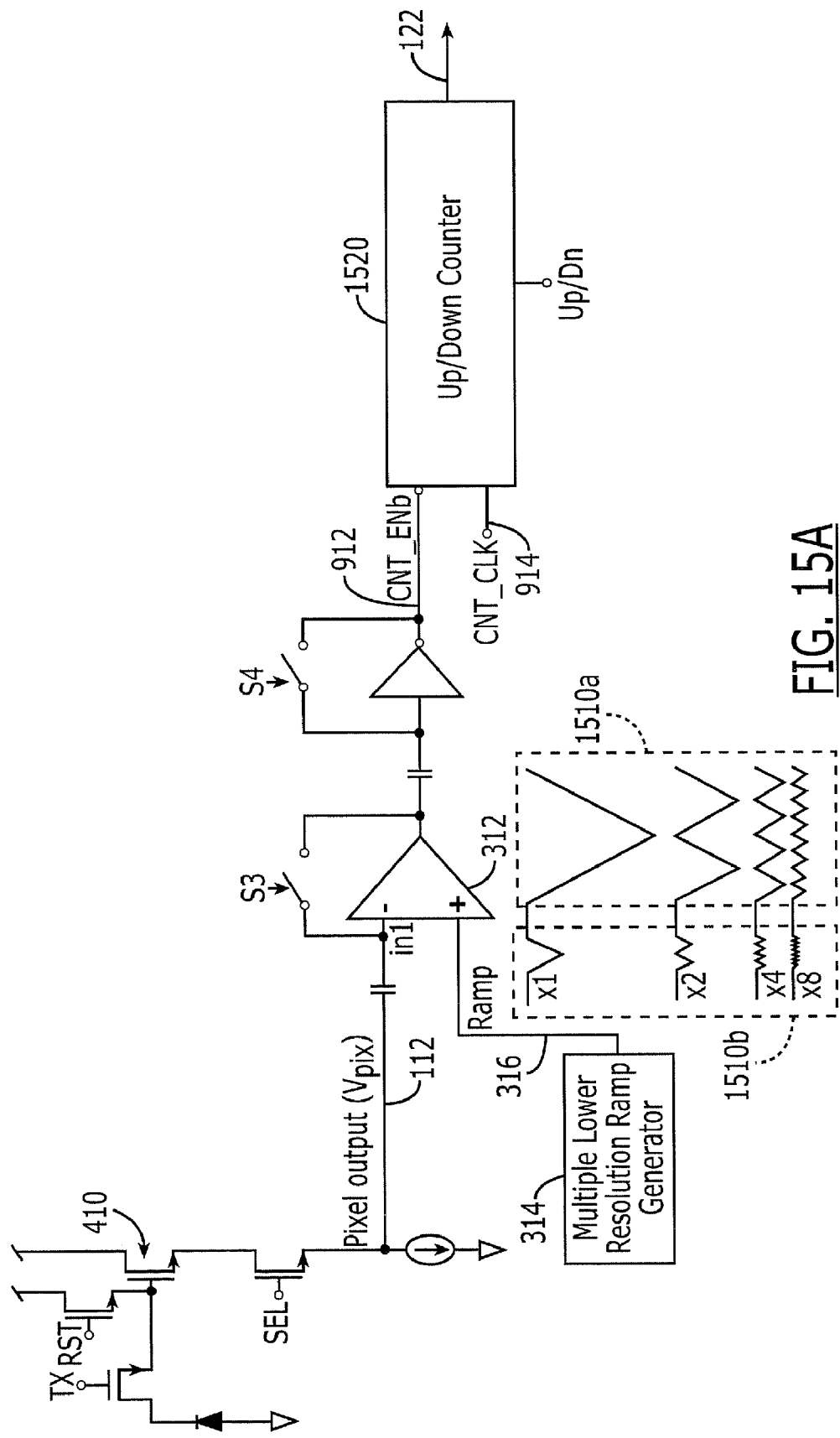
Figure 15B:
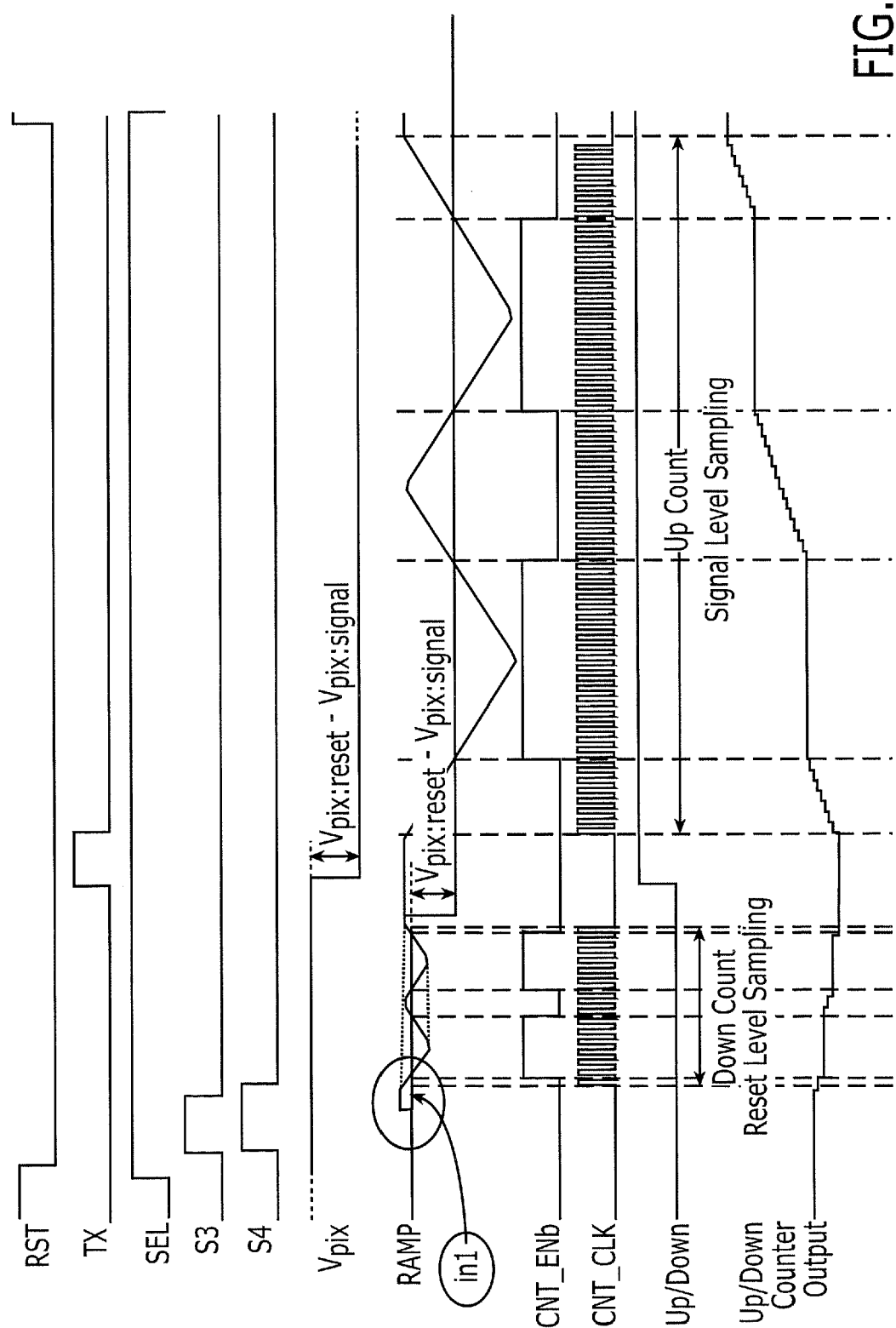

In contrast, embodiments of FIGS. 15A/B and 16A/B can also sample the reset phase's pixel noise and reduce or eliminate noise by offset subtraction and multiple sampling to suppress the offset sampling phase and thereby increase the accuracy of the offset analog-to-digital conversion result. More specifically, FIG. 15A illustrates other embodiments of the present invention, wherein pixel and ADC noise can be reduced. More particularly, as shown in FIGS. 15A and 15B, prior to applying the series of up and down ramps 1510a a small series of offset compensating ramps 1510b are applied. Moreover, an initial offset voltage shown by the circled in1 in FIG. 15B can be used to compensate for the comparator's offset voltage. An up/down counter 1520 is used. Embodiments of FIG. 15A that use a conventional sawtooth staircase ramp are described in Yoshihara et al. "*A 1/1.8-inch 6.4 Mpixel 60 frames/s CMOS Image Sensor With Seamless Mode Change*" *IEEE Journal of Solid-State Circuits* 41(12): 2998-3006 (2006); Nitta et al. "*High-Speed Digital Double Sampling with Analog CDS on Column Parallel ADC Architecture for Low-Noise Active Pixel Sensor*" *IEEE International Solid-State Circuits Conference* (2006); U.S. Pat. No. 7,129,883 to Muramatsu; and U.S. Pat. No. 7,088,279 to Muramatsu et al., the disclosures of which are hereby incorporated by reference in their entirety as if set forth fully herein. Accordingly, these embodiments need not be described in detail herein.

Figure 16A:
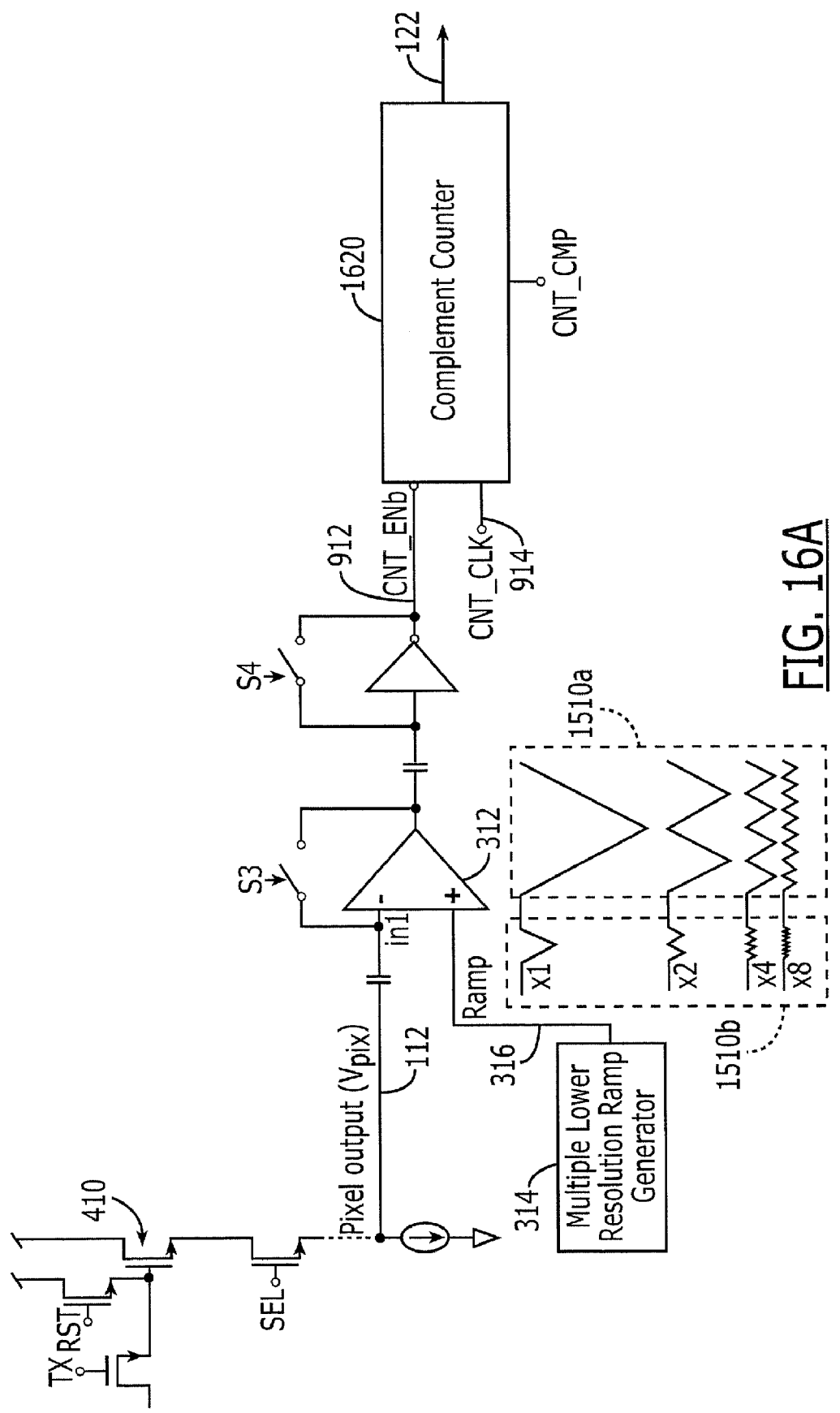
Figure 16B:
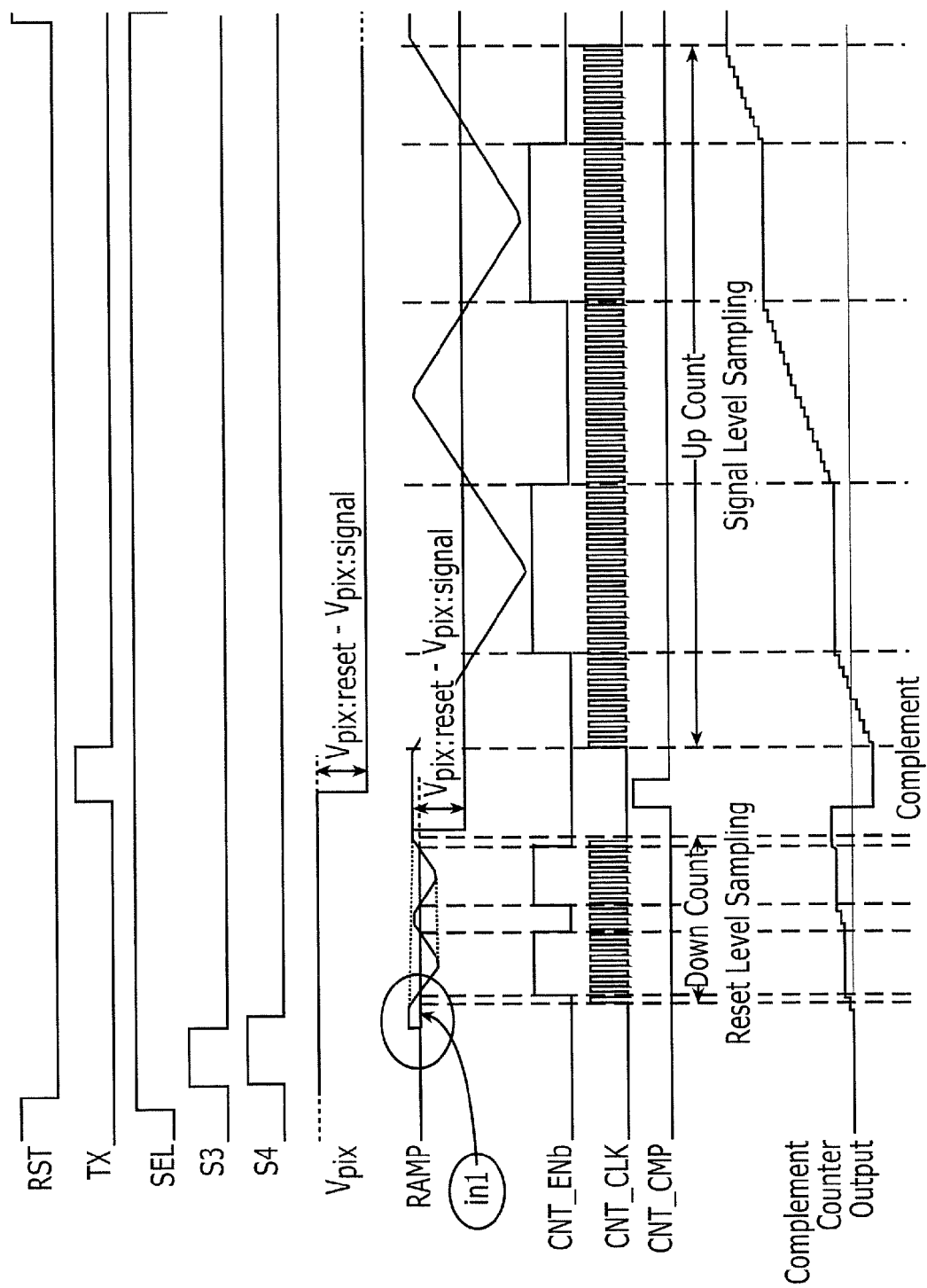

FIGS. 16A and 16B illustrate other embodiments of the present invention that use a complement counter 1620 instead of an up/down counter 1520. A DAC with a complement counter that uses a sawtooth staircase ramp voltage is described in U.S. patent application Ser. No. 11/887,027 to Ham et al., entitled "*Digital Double Sampling Method, a Related CMOS Image Sensor, and a Digital Camera Comprising the CMOS Image Sensor*", assigned to the assignee of the present invention, the disclosure of which is hereby incorporated by reference as if set forth fully herein. Accordingly, embodiments of FIGS. 16A and 16B need not be described in detail herein.

Figure 17:
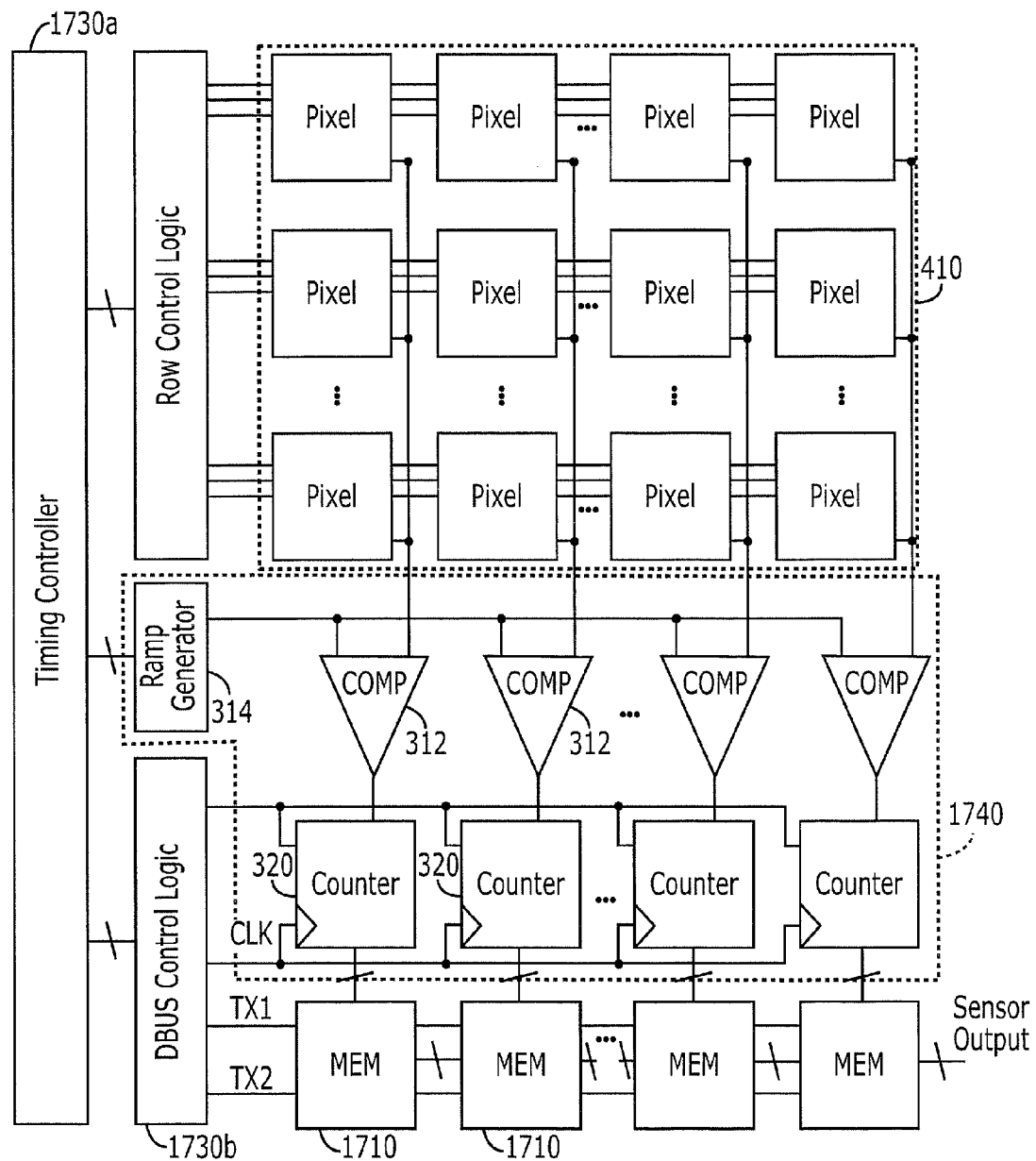
FIGS. 17 and 18 are block diagrams of CMOS image sensors using pseudo-multiple sampling according to various embodiments of the present invention.
Figure 18:
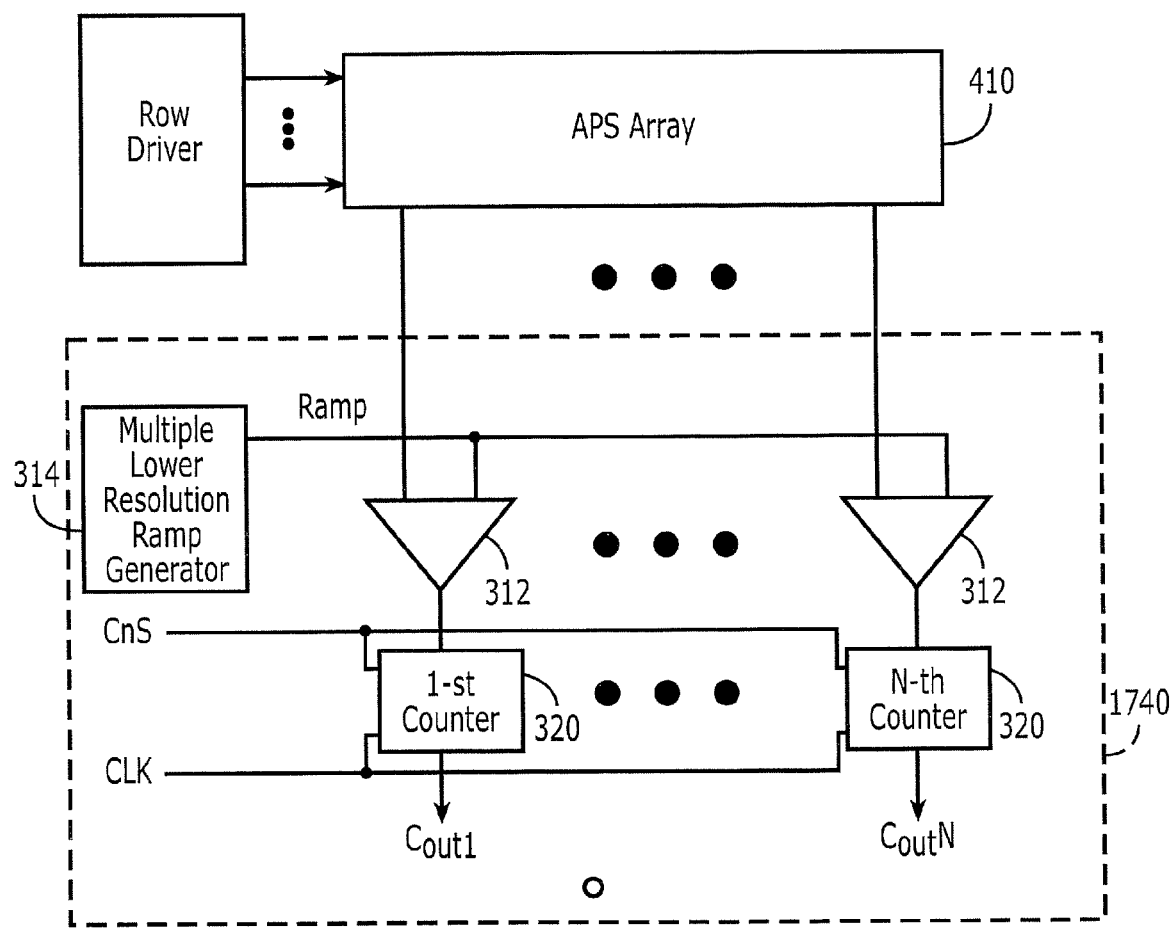

FIG. 17 is a block diagram of a CMOS image sensor system that uses a pseudo-multiple sampling ADC 1740 according to various embodiments of the present invention. As shown in FIG. 17, a pseudo-multiple sampling ADC 1740 includes comparators 312, counters 320 and memory devices 1710 that store the results to provide sensor outputs. These devices are controlled by a controller that may include a timing controller 1730a, DBUS control logic 1730b and row control logic 1730c. FIG. 18 illustrates other embodiments that include comparator 312, ramp generator 314 and counters 320. As shown, a common ramp generator and controller may be provided for the columns of pixels.

Figure 19A:
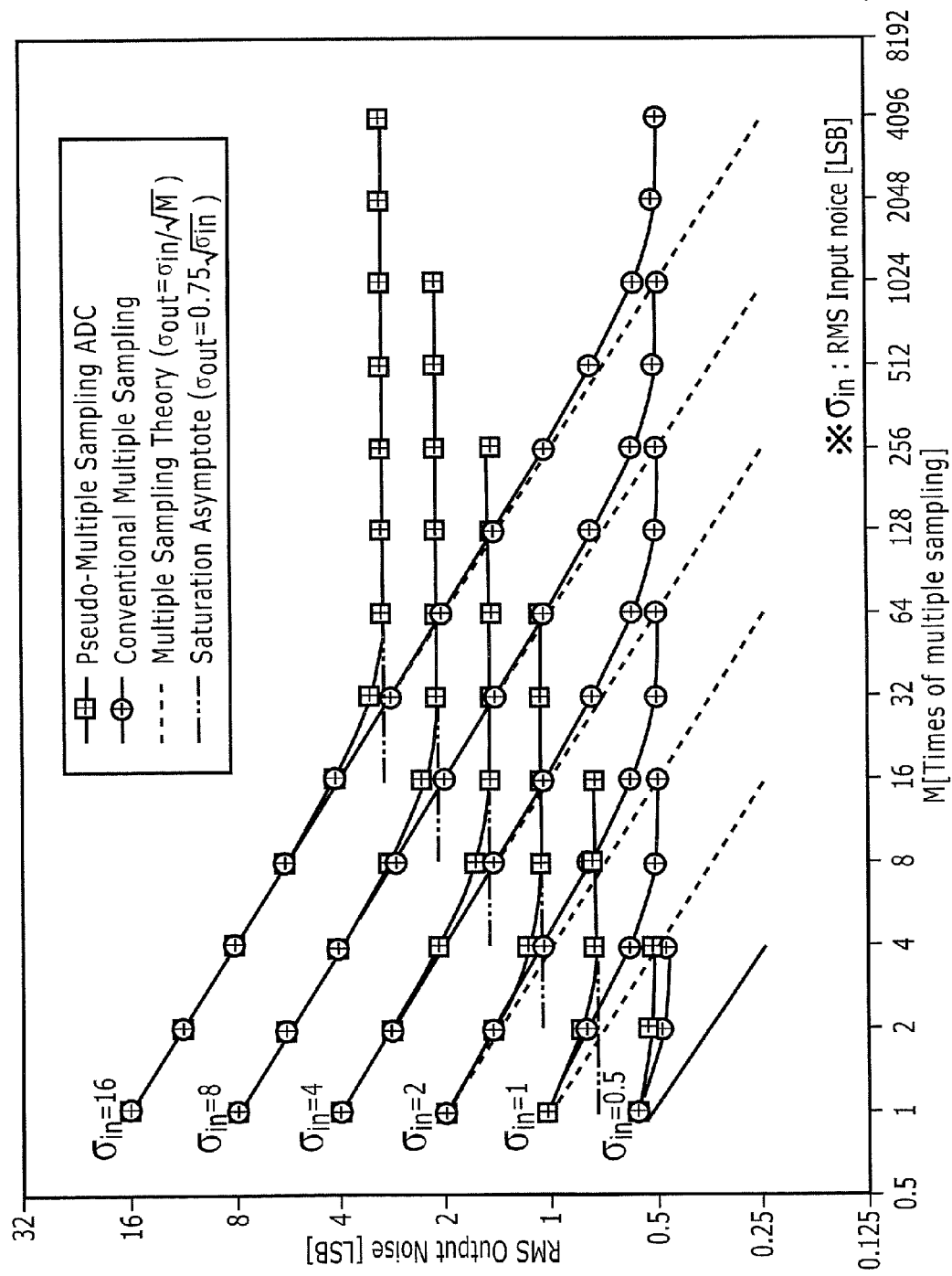
FIGS. 19A and 19B graphically illustrate simulated noise of conventional multiple sampling analog-to-digital converters and pseudo-multiple sampling analog-to-digital converters according to various embodiments of the present invention.
Figure 19B:
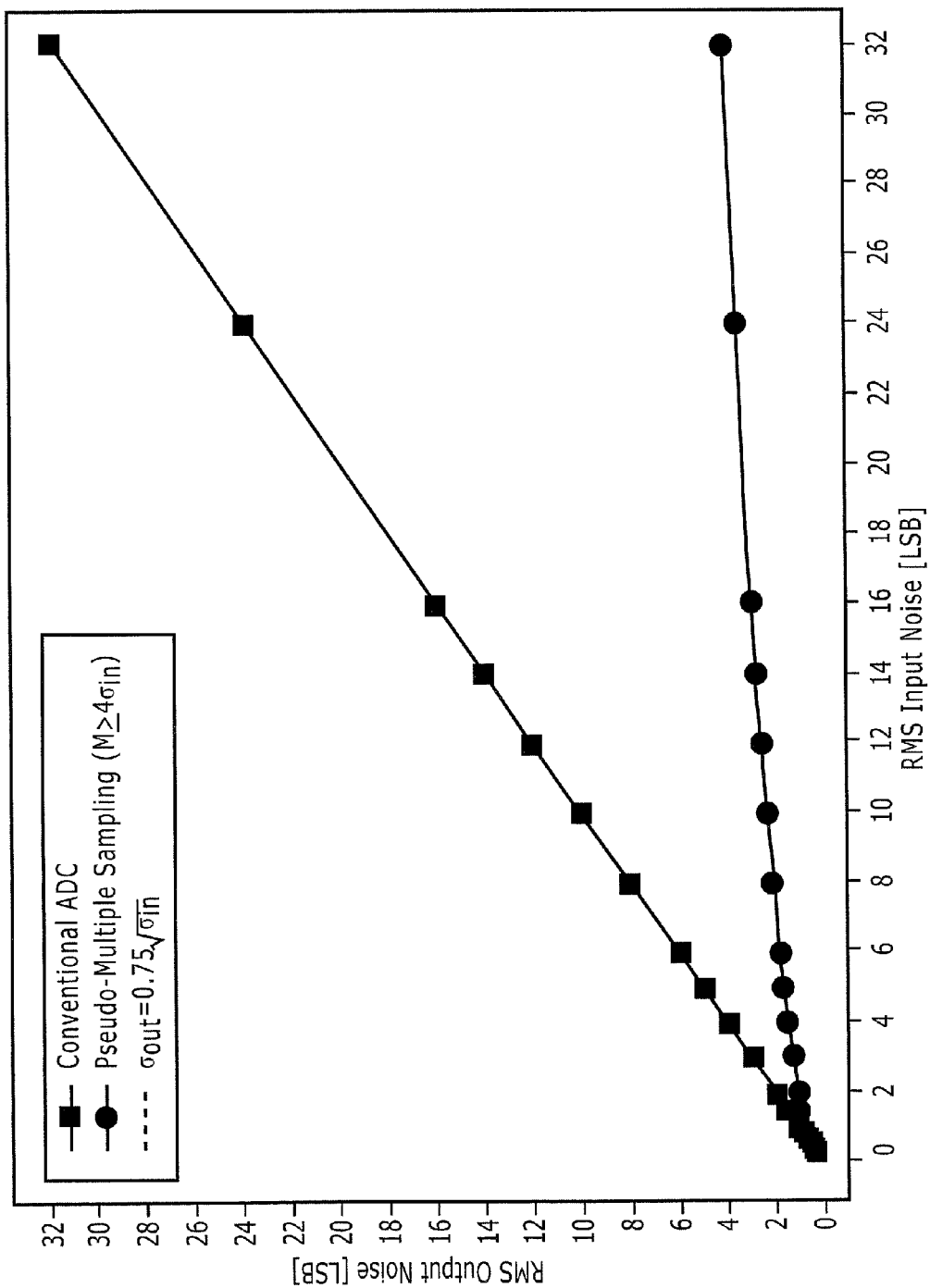

FIGS. 19A and 19B graphically illustrate simulations of noise reduction according to various embodiments of the present invention. These simulations were carried out using a program written in C language and simulated white Gaussian noise having 0.5 LSB offset, simulating thermal noise. For each condition, the simulation was repeated 1,000,000 times.

FIG. 19A illustrates RMS input noise versus RMS output noise for a pseudo-multiple sampling ADC according to embodiments of the present invention, and for a conventional multiple sampling ADC that uses sawtooth waves. Results for multiple sampling theory and saturation asymptotes also are shown. FIG. 19B illustrates RMS input noise versus RMS output noise for a conventional ADC and a pseudo-multiple sampling ADC according to embodiments of the present invention.

FIG. 19A illustrates that for small numbers of multiple sampling, the same noise reduction effect can be obtained by embodiments of the invention as in conventional multiple sampling. Moreover, for larger numbers of multiple sampling, noise can be even further reduced according to embodiments of the present invention. More specifically, for M<the RMS input noise, the noise reduction can be the same as conventional multiple sampling: $\sigma_{out}=\sigma_{in}/\sqrt{M}$. Moreover, for larger values of M where M is greater than or equal to 4σin, noise can be reduced to $\sigma_{out}=0.75\times\sqrt{\sigma_{in}}$.

Pseudo-multiple sampling according to various embodiments of the invention may be sharply contrasted with conventional multiple sampling. Conventional multiple sampling ADCs can sample a signal multiple times and average the results to decrease noise. However, conventional multiple sampling takes M times the standard A/D conversion time and may need a digital block including memory and an arithmetic unit to store the results and then perform averaging. In sharp contrast, embodiments of the present invention can sample a signal multiple times but at reduced resolution and different offset quantization levels, and can simply sum the results. Accordingly, pseudo-multiple sampling need not use extra time and need not use extra building blocks, but can have almost the same noise suppression capability.

Pseudo-multiple sampling methods, systems and devices for analog-to-digital conversion according to various embodiments of the present invention can use a ramp voltage generator and a comparator like a conventional ramp-compare ADC. However, profound and significant differences are provided according to embodiments of the present invention because the ramp voltage is not a saw-tooth voltage, but is, rather, a plurality of ramp-up and ramp-down voltages that are configured to allow sampling to take place at lower resolution, and the results of the pseudo-multiple sampling to simply be added to provide the correct digital value. Thus, although an overall architecture of a ramp-compare ADC may be used, the profound differences can allow more efficient analog-to-digital conversion to take place along with an equivalent noise reduction, while allowing simplified circuitry to be used.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of converting an analog signal to a digital value having a predetermined number of bits that define predetermined quantization levels, the method comprising:
   repeatedly sampling the analog signal at a resolution that is less than that which is defined by the predetermined number of bits, such that the repeated sampling includes the predetermined quantization levels of the predetermined number of bits, to obtain a plurality of lower resolution sampling results; and
   summing the plurality of lower resolution sampling results to obtain the digital value having the predetermined number of bits.

2. A method according to claim 1 wherein the predetermined quantization levels are equally spaced apart.

3. A method according to claim 1 wherein at least three of the predetermined quantization levels are unequally spaced apart.

4. A method according to claim 1 wherein repeatedly sampling comprises repeatedly sampling the analog signal using a series of ramp-up and ramp-down sampling voltages.

5. A method according to claim 4 wherein the series of ramp-up and ramp-down sampling voltages comprises a series of staircase, constant slope and/or multiple slope ramp-up and ramp-down sampling voltages.

6. A method according to claim 1 wherein repeatedly sampling comprises repeatedly sampling the analog signal at a resolution that is less than that which is defined by the predetermined number of bits, using quantization levels among the repeated samplings that are offset from one another.

7. A method according to claim 6 wherein repeatedly sampling comprises repeatedly sampling the analog signal M times using $2^N/M$ quantization levels, wherein N is the predetermined number of bits.

8. A method according to claim 7 wherein repeatedly sampling the analog signal M times using $2^N/M$ quantization levels comprises repeatedly sampling the analog signal M times using $2^N/M$ quantization levels among the repeated samplings that are offset from one another by at least a quantization level that corresponds to a least significant bit of the digital value.

9. A method according to claim 8 wherein repeatedly sampling the analog signal M times using $2^N/M$ quantization levels comprises generating a series of ramp voltages having a total of M ramp-up and ramp-down voltages, wherein a respective ramp-up and ramp-down voltage includes $2^N/M$ ramp voltage steps of size M.

10. A method according to claim 7 wherein repeatedly sampling the analog signal M times using $2^N/M$ quantization levels comprises generating a series of ramp voltages having a total of M ramp-up and ramp-down voltages, wherein an immediately succeeding ramp voltage ends at a different voltage than that which an immediately preceding ramp voltage begins.

11. A method according to claim 7 wherein repeatedly sampling the analog signal M times using $2^N/M$ quantization levels comprises generating a series of ramp voltages having a total of M ramp-up and ramp-down voltages, wherein starting voltages and ending voltages of the series of ramp voltages include all quantization levels of the predetermined number of bits.

12. A method according to claim 7 wherein repeatedly sampling the analog signal M times using $2^N/M$ quantization levels comprises generating a series of ramp voltages having a total of M ramp-up and ramp-down voltages, wherein the ramp voltages increase or decrease by M times a voltage corresponding to the predetermined quantization level, per unit time.

13. A method according to claim 1 wherein repeatedly sampling comprises repeatedly comparing the analog signal to a series of ramp voltages and repeatedly identifying a lower resolution digital value when the ramp voltage corresponds to the analog signal.

14. A method according to claim 13 wherein summing comprises summing the lower resolution digital values that are identified.

15. A method according to claim 13 wherein repeatedly comparing the analog signal to a series of ramp voltages comprises repeatedly comparing sums of the analog signal and the series of ramp voltages to a reference voltage.

16. A method according to claim 13 wherein repeatedly comparing the analog signal to the series of ramp voltages is performed while accounting for offsets.

17. A method according to claim 1 wherein the analog signal is generated by a CMOS image sensor.

18. An image sensing method comprising:
   generating an analog signal in response to electromagnetic energy incident on a sensing pixel from an image; and
   converting the analog signal to a digital value having a predetermined number of bits that define predetermined quantization levels by repeatedly sampling the analog signal at a resolution that is less than that which is defined by the predetermined number of bits, such that the repeated sampling includes the predetermined quantization levels of the predetermined number of bits, to obtain a plurality of lower resolution sampling results, and summing the plurality of lower resolution sampling results to obtain the digital value having the predetermined number of bits.

19. A method according to claim 18 wherein repeatedly sampling comprises repeatedly sampling the analog signal using a series of staircase, constant slope and/or multiple slope ramp-up and ramp-down sampling voltages.

20. A method according to claim 18 wherein repeatedly sampling comprises repeatedly sampling the analog signal analog signal M times using $2^N/M$ quantization levels, wherein N is the predetermined number of bits and the quantization levels among the repeated samplings are offset from one another.

21. A method according to claim 20 wherein repeatedly sampling the analog signal M times using $2^N/M$ quantization levels comprises generating a series of ramp voltages having a total of M ramp-up and ramp-down voltages, wherein a respective ramp-up and ramp-down voltage includes $2^N/M$ ramp voltage steps of size M.

22. An Analog-to-Digital Converter (ADC) for converting an analog signal to a digital value having a predetermined number of bits that define a predetermined quantization step, the ADC comprising:
  a ramp generator that is configured to generate a series of ramp voltages having at least one ramp-up and at least one ramp-down voltage, wherein the ramp-up and ramp-down voltages increase or decrease per unit time by a multiple, greater than one, of the predetermined quantization step;
  a comparator that is configured to repeatedly compare the analog signal to the series of ramp voltages to identify a plurality of times when the at least one ramp-up voltage and the at least one ramp-down voltage correspond to the analog signal; and
  a counter that is responsive to the comparator and that is configured to repeatedly sum digital values of the units of time for the plurality of times when the at last one ramp-up voltage and the at least one ramp-down voltage correspond to the analog signal, to obtain the digital value.

23. An ADC according to claim 22 wherein the series of ramp-up and ramp-down voltages comprises a series of staircase, constant slope and/or multiple slope ramp-up and ramp-down voltages.

24. An ADC according to claim 22:
  wherein the ramp generator is further configured to generate at least one second ramp voltage;
  wherein the comparator is further configured to compare the at least one second ramp voltage to an offset voltage to identify at least one time when the at least one second ramp voltage corresponds to the offset voltage; and
  wherein the counter is configured to subtract out a digital value of the at least one time when the at least one second ramp voltage corresponds to the offset voltage.

25. A method of converting an analog signal to a digital value having a predetermined number of bits, the method comprising:
  repeatedly converting the analog signal to a digital value having fewer than the predetermined number of bits, to obtain a plurality of digital values having fewer than the predetermined number of bits; and
  summing the plurality of digital values having fewer than the predetermined number of bits, to obtain the digital value having the predetermined number of bits.

* * * * *